(12) United States Patent
Gaillardon et al.

(10) Patent No.: US 10,348,306 B2
(45) Date of Patent: Jul. 9, 2019

(54) RESISTIVE RANDOM ACCESS MEMORY BASED MULTIPLEXERS AND FIELD PROGRAMMABLE GATE ARRAYS

(71) Applicants: UNIVERSITY OF UTAH RESEARCH FOUNDATION, Salt Lake City, UT (US); École Polytechnique Fédérale de Lausanne, Lausanne (CH)

(72) Inventors: Pierre-Emanuel Gaillardon, Salt Lake City, UT (US); Xifan Tang, Lausanne (CH); Gain Kim, Lausanne (CH); Giovanni De Micheli, Lausanne (CH); Edouard Giacomin, Salt Lake City, UT (US)

(73) Assignees: University of Utah Research Foundation, Salt Lake City, UT (US); Ecole Polytechnique Federale de Lausanne (EPFL), Lausanne (CH)

( * ) Notice: Subject to any disclaimer, the term of this patent is extended or adjusted under 35 U.S.C. 154(b) by 0 days.

(21) Appl. No.: 15/916,566

(22) Filed: Mar. 9, 2018

(65) Prior Publication Data
US 2018/0262197 A1    Sep. 13, 2018

Related U.S. Application Data

(60) Provisional application No. 62/609,685, filed on Dec. 22, 2017, provisional application No. 62/469,351, filed on Mar. 9, 2017.

(51) Int. Cl.
*G11C 13/00*    (2006.01)
*H03K 19/173*   (2006.01)
(Continued)

(52) U.S. Cl.
CPC ..... *H03K 19/1737* (2013.01); *G06F 17/5054* (2013.01); *G11C 13/0026* (2013.01);
(Continued)

(58) Field of Classification Search
CPC ........... G06F 17/5054; G11C 13/0026; G11C 13/0028; H01L 27/2463; H01L 45/1206;
(Continued)

(56) References Cited

U.S. PATENT DOCUMENTS 8,269,203 B2    9/2012   Greene et al.
8,331,130 B2    12/2012  Yasuda et al.
(Continued)

FOREIGN PATENT DOCUMENTS

FR       2979737 A1      3/2013
WO   WO 2017/053329 A1   3/2017

OTHER PUBLICATIONS

Akinaga et al., "Resistive Random Access Memory (ReRAM) Based on Metal Oxides," Proceedings of the IEEE, 2010, 98(12): 2237-2251.
(Continued)

Primary Examiner — Alexander H Taningco
Assistant Examiner — Kurtis R Bahr
(74) Attorney, Agent, or Firm — Michael Best & Friedrich LLP

(57) ABSTRACT

Resistive random access memory (RRAM) based multiplexers and field programmable gate arrays (FPGAs) are provided. The RRAM-based multiplexers and FPGAs include a 4T1R programming structure to program the RRAMs. The programming structure includes two programming transistors connected between the power supply and the top electrode of the RRAM and two programming transistors connected between the power supply and the bottom electrode of the RRAM. The programming transistors are used
(Continued)

to set and rest the RRAMs. In the RRAM-based multiplexer programming transistors connected to the bottom electrodes are shared between a plurality of RRAMs. The shared programming transistors and an output inverter of the RRAM are provided in a deep N-well of the RRAM-based multiplexer. The programming transistors connected to the top electrodes of the RRAMs and a plurality of input inverters are provided in a regular well of the RRAM-based multiplexer.

20 Claims, 12 Drawing Sheets

(51) Int. Cl.
    *H01L 45/00*      (2006.01)
    *H01L 27/24*      (2006.01)
    *G06F 17/50*      (2006.01)
    *H03K 19/177*      (2006.01)

(52) U.S. Cl.
    CPC ...... *G11C 13/0028* (2013.01); *H01L 27/2463* (2013.01); *H01L 45/1206* (2013.01); *H01L 45/1253* (2013.01); *H03K 19/1776* (2013.01)

(58) Field of Classification Search
    CPC ............ H01L 45/1253; H03K 19/1737; H03K 19/1776
    See application file for complete search history.

(56) References Cited

U.S. PATENT DOCUMENTS

| | | | |
|---|---|---|---|
| 8,952,722 | B2 | 2/2015 | Ikeda et al. |
| 9,165,644 | B2 | 10/2015 | Kamalanathan et al. |
| 9,276,573 | B2 | 3/2016 | Gaillardon et al. |
| 9,444,464 | B1 | 9/2016 | McCollum et al. |
| 9,461,649 | B2 | 10/2016 | Cong et al. |
| 9,466,363 | B2 | 10/2016 | Endoh et al. |
| 9,583,171 | B2 | 2/2017 | Kim et al. |
| 9,607,675 | B1* | 3/2017 | Huang ............... G11C 11/1673 |
| 2011/0019495 | A1* | 1/2011 | Scheuerlein ............ G11C 7/18 365/230.06 |
| 2011/0228595 | A1* | 9/2011 | Rao .......................... G11C 8/08 365/158 |
| 2013/0010539 | A1* | 1/2013 | Shim .................. G11C 16/0433 365/185.11 |
| 2015/0117086 | A1* | 4/2015 | Kim ................... G11C 11/1675 365/148 |
| 2015/0249096 | A1 | 9/2015 | Lupino et al. |
| 2015/0371705 | A1 | 12/2015 | Onkaraiah et al. |
| 2016/0118120 | A1* | 4/2016 | Tseng ................ G11C 13/0097 365/148 |
| 2016/0322101 | A1 | 11/2016 | Sacchetto et al. |
| 2017/0117291 | A1 | 4/2017 | Or-Bach et al. |
| 2017/0243624 | A1* | 8/2017 | Foong ................ G11C 11/1659 |
| 2017/0345496 | A1* | 11/2017 | Liu ....................... G11C 11/161 |

OTHER PUBLICATIONS

Burr et al., "Overview of Candidate Device Technologies for Storage-Class-Memory," IBM J. R&D, 2008, vol. 52, No. 4/5.
Chen et al., "Highly Scalable Hafnium Oxide Memory with Improvements of Resistive Distribution and Read Disturb Immunity," IEEE IEDM, 2009, pp. 1-4.
Chen et al., "Non-volatile 3D stacking RRAM-based FPGA," IEEE FPL, 2012, pp. 367-372.
Chiasson et al., "Should FPGAs Abandon the Pass-gate?," FPL, 2013, pp. 1-8.
Clark et al., "ASAP7: A 7-nm FinFET Predictive Process Design Kit," Microelectronics Journal, 2016, 53: 105-115.
Cong et al., "FPGA-RPI: A Novel FPGA Architecture With RRAM-Based Programmable Interconnects," IEEE TVLSI, 2014, 22(4): 864-877.
El-Ayat et al., "A CMOS Electrically Configurable Gate Array," IEEE JSSC, 24(3): 752-762.
Elmore, "The Transient Response of Damped Linear Networks with Particular Regard to Wideband Amplifiers," Journal of Applied Physics, 1948, 19(1): 55-63.
Gaillardon et al., "A Ultra-Low-Power FPGA Based on Monolithically Integrated RRAMs," Proceedings of the 2015 Design, Automation & Test in Europe Conference & Exhibition, 2015, pp. 1203-1208.
Gaillardon et al., "Emerging Memory Technologies for Reconfigurable Routing in FPGA Architecture," IEEE ICECS, 2010, pp. 62-65.
Gaillardon et al., "GMS: Generic Memristive Structure for Non-Volatile FPGAs," IEEE/IFIP VLSI-SoC, 2012, pp. 94-98.
Gaillardon et al., "Phase-Change-Memory-based Storage Elements for Configurable Logic," IEEE FPT, 2010, pp. 17-20.
Greene et al., "A 65nm Flash-Based FPGA Fabric Optimized for Low Cost and Power," ACM FPGA, 2011, pp. 87-95.
Huang et al., "High-Density and High-Reliability Nonvolatile Field-Programmable Gate Array With Stacked 1D2R RRAM Array," IEEE TVLSI, 2015, 24(1): 139-150.
Jiang et al., "Verilog—A Compact Model for Oxide-based Resistive Random Access Memory," IEEE SISPAD, 2014, pp. 41-44.
Lee et al., "Interconnect Driver Design for Long Wires in Field-Programmable Gate Arrays," Journal of Signal Processing Systems, Springer, 2008, vol. 51, No. 1.
Liauw et al., "Nonvolatile 3D-FPGA with Monolithically Stacked RRAM-based Configuration Memory," ISSCC, 2012, pp. 406-408.
Omam et al., "A study on buffer distribution for RRAM-based FPGA routing structures," IEEE 6th Latin American Symposium on Circuits & Systems (LASCAS), 2015.
Tanachutiwat et al., "FPGA Based on Integration of CMOS and RRAM," IEEE TVLSI, 2010, 19(11): 2023-2032.
Tang et al, "Accurate Power Analysis for Near-Vt RRAM-based FPGA," IEEE FPL, 2015, pp. 174-177.
Tang et al., "A Study on the Programming Structures for RRAM-based FPGA Architectures," IEEE Transactions on Circuits and Systems I: Regular Papers, 2016, 63(4): 503-516.
Tang et al., "Circuit Designs of High-performance and Low-power RRAM-based Multiplexers based on 4T(ransistor)1R(RAM) Programming Structure," IEEE Transactions on Circuits and Systems I: Regular Papers, 2016, 64(5): 1173-1186.
Tang et al., "Optimization Opportunities in RRAM-based FPGA Architectures," IEEE 8th Latin American Symposium on Circuits & Systems (LASCAS), 2017, pp. 281-284.
Tang et al., "Physical Design Considerations of One-level RRAM-based Routing Multiplexers," Proceedings of the 2017 ACM on International Symposium on Physical Design, 2017, pp. 47-54.
Tang et al., A High-performance Low-power Near-Vt RRAM-based FPGA Architecture Using One-Level RRAM-based Multiplexers, IEEE ICFPT, 2014, pp. 207-215.
Waser et al., "Nanoionics-based Resistive Switching Memories," Nature Materials, 2007, 6: 833-840.
Wong et al., "Metal-Oxide RRAM, Proceedings of the IEEE," 2012, 100(6): 1951-1970.
Zhu, "Magnetoresistive Random Access Memory: The Path to Competi-tiveness and Scalability," Proceedings of the IEEE, 2008, 96(11): 1786-1798.

* cited by examiner

RESISTIVE RANDOM ACCESS MEMORY BASED MULTIPLEXERS AND FIELD PROGRAMMABLE GATE ARRAYS

RELATED APPLICATIONS

This application claims priority to U.S. Provisional Application No. 62/469,351, filed Mar. 9, 2017 and U.S. Provisional Application No. 62/609,685, filed Dec. 22, 2017, the entire contents of which are hereby incorporated by reference.

FIELD

Embodiments relate to Field Programmable Gate Arrays (FPGAs).

SUMMARY

Field Programmable Gate Arrays (FPGAs) are used in many electronic devices to make reconfigurable digital circuits. FPGAs include an array of heterogeneous blocks surrounded by global routing architecture. Heterogeneous blocks include Configurable Logic Blocks (CLBs), memory banks, and Digital Signal Processor (DSP) blocks. The global routing architecture is built with Connection Blocks (CBs), which connect heterogeneous blocks to routing tracks, and switch boxes (SBs), which interconnect routing tracks together.

The Configurable Logic Blocks include a plurality of Basic Logic Elements (BLEs) each of which includes a Look Up Table (LUT), a D Flip-Flop (FF), and a output selector (2:1 Selector). A group of multiplexers called local routing architecture interconnect the Configurable Logic Block input and output pins to the input and output pins of the Basic Logic Elements.

Look Up Tables are typically implemented using Static Random-Access Memories (SRAMs). Multiplexers are typically implemented using Complementary metal-oxide semiconductor (CMOS) multiplexers. CMOS multiplexers are typically implemented by pass-transistors or transmission gates, whose gate signals are controlled by control lines. CMOS multiplexers can be built with different structures to trade off area, delay, and power. Multiplexer structures may include a one-level, a two-level, or a tree-like structure implemented by transmission gates.

In Resistive Random Access Memory (RRAM)-based FPGAs, the SRAMs, used to store the configurations, are replaced with non-volatile RRAMs. In the RRAM-based multiplexers, SRAMs and transmission gates are replaced by RRAMs. RRAMs are employed not only for storing routing configurations but also to route signals.

However, integrating RRAMs into FPGA and multiplexers has been challenging. There is a need for programming structures that efficiently configure the RRAMs and still provide area, delay, and current density improvements. In addition, there is a need for efficient circuit designs for RRAM-based multiplexers to realize the promised area, delay, and current density improvements over CMOS technology.

One embodiment provides a multiplexing structure. The multiplexing structure includes a plurality of resistive random access memories and a plurality of multiplexer inputs coupled to a plurality of top electrodes of the plurality of resistive random access memories. The multiplexing structure also includes a multiplexer output coupled to a plurality of bottom electrodes of the plurality of resistive random access memories and a plurality of first driving elements coupled to the plurality of top electrodes. The multiplexing structure further includes a second driving element coupled to the plurality of bottom electrodes. The second driving element is provided in a deep N-well of the multiplexor and the plurality of first driving elements and the second driving element program the plurality of resistive random access memories. The multiplexing structure also includes a first voltage domain providing a power supply to the plurality of first driving elements and a second voltage supply providing a power supply to the second driving element. The first voltage domain is one of a constant voltage domain and a switchable voltage supply and the second voltage domain is the other of the constant voltage domain and the switchable voltage supply.

In one instance, the multiplexing structure also includes a plurality of multiplexer input inverters provided between the plurality of multiplexer inputs and the plurality of top electrodes. The first voltage domain provides the power supply to the plurality of multiplexer input inverters. The multiplexing structure also includes a plurality of gating inverters provided between the first voltage domain and the plurality of multiplexer input inverters. The plurality of gating inverters are controlled by an enable signal.

In another instance, to set a first resistive random access memory from the plurality of resistive random access memories, the switchable voltage supply provides a setting voltage to the second driving element. To reset the first resistive random access memory from the plurality of resistive random access memories, the switchable voltage supply provides a resetting voltage, different from the setting voltage, to the second driving element.

In another instance, the second driving element includes a first transistor connected between a first positive supply of the second voltage domain and the plurality of bottom electrodes and a second transistor connected between a first negative supply of the second voltage domain and the plurality of bottom electrodes.

In another instance, the first voltage domain is the constant voltage domain and provides a voltage of $V_{DD}$ at a second positive supply connected to the plurality of first driving elements and 0V at a second negative supply connected to the plurality of first driving elements.

In another instance, providing the setting voltage includes providing $-V_{prog}+2V_{DD}$ at the first positive supply and providing $-V_{prog}+V_{DD}$ at the first negative supply.

In another instance, providing the resetting voltage includes providing $V_{prog}$ at the first positive supply and providing $V_{prog}-V_{DD}$ at the first negative supply.

In another instance, a nominal value of $V_{DD}$ is between 0.7-1V and a nominal value of $V_{prog}$ is 2.5-3.5V.

In another instance, the gating inverters are disabled during a programming operation of the plurality of resistive random access memories.

In another instance, the plurality of first driving elements and the second driving element are controlled by a scan chain organization including one or more flip-flops.

In another instance, the plurality of first driving elements and the second driving element are controlled by a memory bank organization including one or more bit lines and one or more word lines coupled to the plurality of first driving elements and the second driving element.

In another instance, the multiplexing structure also includes an output inverter provided between the plurality of bottom electrodes and the multiplexer output. The switchable voltage supply provides the power supply to the output inverter.

Another embodiment provides a field programmable gate array. The field programmable gate array includes a resistive random access memory including a top electrode and a bottom electrode and a first transistor and a second transistor coupled to the top electrode. The field programmable gate array also includes a third transistor and a fourth transistor coupled to the bottom electrode. The resistive random access memory is set when the first transistor and the fourth transistor are enabled and the resistive random access memory is reset when the second transistor and the third transistor are enabled. The field programmable gate array also includes a scan chain organization having a first flip-flop coupled to and controlling the first transistor and the fourth transistor and a second flip-flop coupled to and controlling the second transistor and the third transistor.

In one instance, the field programmable gate array also includes one or more voltage supplies, wherein sources of the first transistor, second transistor, third transistor, and the fourth transistor are directly connected to the one or more voltage supplies without driving inverters.

In another instance, the field programmable gate array also includes a constant voltage domain providing a power supply to the first transistor and the third transistor and a switchable voltage supply providing a power supply to the second transistor and the fourth transistor.

Another embodiment provides a field programmable gate array comprising a resistive random access memory including a top electrode and a bottom electrode and a first transistor and a second transistor coupled to the top electrode. The field programmable gate array also includes a third transistor and a fourth transistor coupled to the bottom electrode. The resistive random access memory is set when the first transistor and the fourth transistor are enabled and the resistive random access memory is reset when the second transistor and the third transistor are enabled. The field programmable gate array further includes a memory bank organization having bit lines coupled to and controlling the first transistor and the third transistor and word lines coupled to and controlling the second transistor and the fourth transistor.

In one instance, the field programmable gate array of also includes one or more voltage supplies, wherein sources of the first transistor, second transistor, third transistor, and the fourth transistor are directly connected to the one or more voltage supplies without driving inverters.

In another instance, the field programmable gate array also includes a constant voltage domain providing a power supply to the first transistor and the third transistor and a switchable voltage supply providing a power supply to the second transistor and the fourth transistor.

Another embodiment provides a multiplexing structure. The multiplexing structure includes a plurality of resistive random access memories and a plurality of multiplexer inputs coupled to a plurality of top electrodes of the plurality of resistive random access memories. The multiplexing structure also includes a plurality of multiplexer input inverters provided between the plurality of multiplexer inputs and the plurality of top electrodes and a multiplexer output coupled to a plurality of bottom electrodes of the plurality of resistive random access memories. The multiplexing structure further includes a multiplexer output inverter provided between the plurality of bottom electrodes and the multiplexer output and a plurality of first driving elements coupled to the plurality of top electrodes. The multiplexing structure also includes a second driving element coupled to the plurality of bottom electrodes. The plurality of first driving elements and the second driving element are provided in a deep N-well of the multiplexor and the plurality of first driving elements and the second driving element program the plurality of resistive random access memories. The multiplexing structure further includes a first voltage domain providing a power supply to the plurality of first driving elements and the second driving element and a second voltage supply providing a power supply to the plurality of multiplexer input inverters and the multiplexer output inverter.

In one instance, the plurality of first driving elements and the second driving element are controlled by a memory bank organization including one or more bit lines and one or more word lines coupled to the plurality of first driving elements and the second driving element.

DETAILED DESCRIPTION

Before any embodiments of the invention are explained in detail, it is to be understood that the embodiments are not limited in their application to the details of construction and the arrangement of components set forth in the following description or illustrated in the following drawings. The embodiments are capable of being practiced or of being carried out in various ways.

Figure 1:
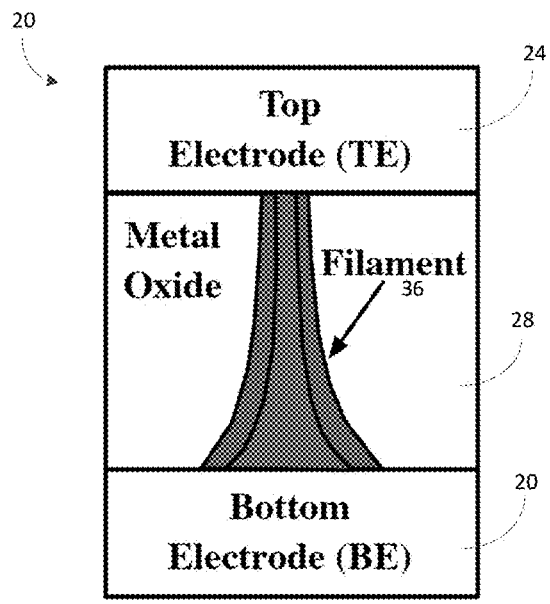
FIG. 1 illustrates a resistive random access memory (RRAM) in accordance with some embodiments.

Referring to FIG. 1, an RRAM 20 includes three layers: a top metal electrode 24, a switching metal oxide 28, and a bottom metal electrode 32. The conductivity of the metal oxide can be modified by applying a programming voltage between the top electrode 24 and the bottom electrode 32, leading to a switching event between two stable resistance states: the Low Resistance State (LRS) and the High Resistance State (HRS). When programmed into Low Resistance State, the RRAMs 20 propagate signals within the datapaths, having similar functionality as transmission gates in an ON state. When programmed into High Resistance State, the RRAMs 20 block signals in datapaths, corresponding to the transmission gates in OFF state. The minimum programming voltages required to trigger set and reset processes are referred to as $V_{set}$ and $V_{reset}$ respectively. The programming currents that are provided in set and reset processes are referred to as $I_{set}$ and $I_{reset}$ respectively. Applying a positive programming voltage $V_{set}$ induces a switching event from the High Resistance State to the Low Resistance State, called the set process. Conversely, a negative programming voltage $V_{reset}$ invokes a switching event from the Low Resistance State to the High Resistance State. Switching events in the metal oxide 28 occur when the applied programming voltage is at or above the minimum programming voltage. A current compliance $I_{set}$ may be enforced during the set process to avoid a permanent breakdown of the device.

The conductivity of the switching metal oxide 28 is determined by conducting filaments 36, which are formed during switching and whose widths depend on the programming current. The wider the filament is, the higher the conductivity is and the lower the resistance is (referred to as $R_{LRS}$). Therefore, a lower/higher resistance of RRAMs 20 can be obtained by driving a higher/lower programming current during the set process. RRAMs 20 can be fabricated on the top of, or between, metal layers using Back-End-of-Line (BEoL) technology. BEoL technology fabrication results in an effective memory cell area as low as $4F^2$ where F is the feature size.

In one embodiment, the programming voltage for the set process $V_{set}$ is approximately 1.3 Volts [V], the programming voltage for the reset process $V_{reset}$ is approximately −1.3 V, the programming current for the set process $I_{set}$ is approximately 1 milli-ampere [mA], and the programming current for the reset process $I_{reset}$ is approximately 1 mA. The resistance in the Low Resistance State $R_{LRS}$ is approximately 500 ohms ($\Omega$) and the resistance in the High Resistance State $R_{HRS}$ is approximately 20 k$\Omega$. In some embodiments, $R_{LRS}$ may be as high as between 2 k$\Omega$ and 6 k$\Omega$ and $R_{HRS}$ may be as high as 20 M$\Omega$. A minimum pulse width for programming the RRAM 20 may be set to 100 nano-seconds [ns]. In one embodiment, the programming voltage for the set process $V_{set}$ is approximately 0.9 V, the programming voltage for the reset process $V_{reset}$ is approximately −0.9 V, the programming current for the set process $I_{set}$ is approximately 500 μA, and the programming current for the reset process $I_{reset}$ is approximately 500 μA. The resistance in the Low Resistance State $R_{LRS}$ is approximately 1.6 k$\Omega$ and the resistance in the High Resistance State $R_{HRS}$ is approximately 23 M$\Omega$.

The RRAM 20 is programmed into the Low Resistance State and the High Resistance State using a programming structure that includes metal-oxide-semiconductor field effect transistors (MOSFETs) (also referred to as programming transistors) to control the programming power supply to the RRAM 20. Programming structures are important in the context of an RRAM-based FPGA in that the programming structure must provide high current to efficiently achieve low $R_{LRS}$ while minimizing the area footprint.

Figure 2:
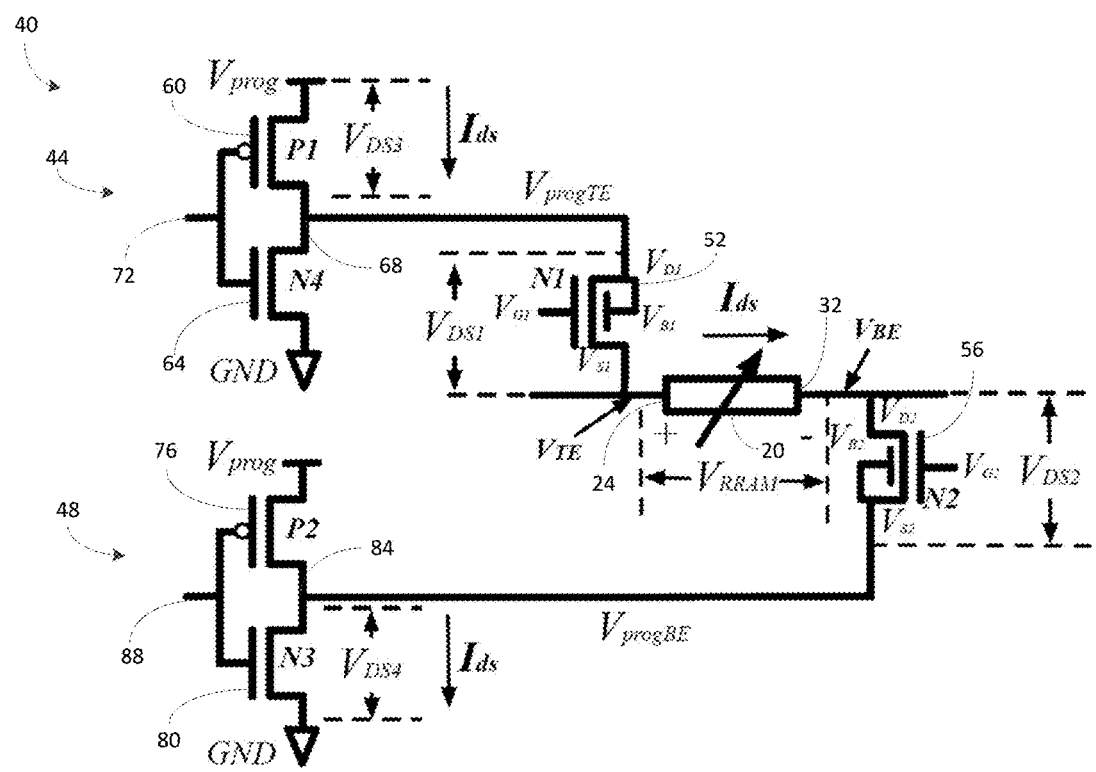
FIG. 2 illustrates a two transistors one RRAM based programming structure in accordance with some embodiments.

FIG. 2 illustrates a circuit design of a two transistor one RRAM (2T1R) programming structure 40. The 2T1R programming structure 40 includes a first driving inverter 44, a second driving inverter 48, a first transistor 52, a second transistor 56, and the RRAM 20. The first driving inverter 44 includes a first p-type transistor 60 and a first n-type transistor 64 coupled in series between a positive power supply $V_{prog}$ and ground GND. The source of the first p-type transistor 60 is coupled to the drain of the first n-type transistor 64 at a connection point 68. The first p-type transistor 60 and the first n-type transistor 64 are driven by a control signal 72. The control signal 72 is provided directly to the first n-type transistor 64, while the control signal 72 is inverted before being provided to the first p-type transistor 60. As a consequence, the first p-type transistor 60 and the first n-type transistor 64 are not turned ON at the same time. Similarly, the second driving inverter 48 includes a second p-type transistor 76 and a second n-type transistor 80 coupled in series between a positive power supply $V_{prog}$ and ground GND. The source of the second p-type transistor 76 is coupled to the drain of the second n-type transistor 80 at a connection point 84. The second p-type transistor 76 and the second n-type transistor 80 are driven by a control signal 88. The control signal 88 is provided directly to the second n-type transistor 80, while the control signal 88 is inverted before being provided to the second p-type transistor 76. As a consequence, the second p-type transistor 76 and the second n-type transistor 80 are not turned ON at the same time.

The drain of the first transistor 52 is coupled to the connection point 68 and the source of the first transistor 52 is coupled to the top electrode 24 of the RRAM 20. The drain of the second transistor 56 is coupled to the connection point 84 and the source of the second transistor 56 is coupled to the bottom electrode 32 of the RRAM 20. In the example illustrated, the first transistor 52 and the second transistor 56 are n-type field effect transistors. The first transistor 52 is controlled by a control signal $V_{G1}$ and the second transistor 56 is controlled by a control signal $V_{G2}$. The first driving inverter 44 provides a voltage level $V_{progTE}$ to the first transistor 52, while the second driving inverter 48 provides a voltage level $V_{progBE}$ to the second transistor 56. Accordingly, the 2T1R programming structure 40 is formed by the two transistors, first transistor 52 and second transistor 56, and one RRAM, RRAM 20.

In a set process, the voltage levels $V_{progTE}$ and $V_{progBE}$ are driven by the first p-type transistor 60 and the second n-type transistor 80 respectively. That is, in the set process, the first p-type transistor 60, the first transistor 52, the second transistor 56, and the second n-type transistor 80 are turned ON, while the first n-type transistor 64 and the second p-type transistor 76 are turned OFF. In a reset process, the voltage levels $V_{progTE}$ and $V_{progBE}$ are driven by the first n-type transistor 64 and the second p-type transistor 76 respectively. That is, in the reset process, the first n-type transistor 64, the first transistor 52, the second transistor 56, and the second p-type transistor 76 are turned ON, while the first p-type transistor 60 and the second n-type transistor 80 are turned OFF.

In the set process, the first driving inverter 44 and the second driving inverter introduce two potential voltage drops caused by drain-to-source voltages $V_{DS3}$ and $V_{DS4}$ of the first p-type transistor 60 and the second n-type transistor 80 respectively. While the 2T1R programming structure 40 two built-in voltage drops caused by the drain-to-source voltages $V_{DS1}$ and $V_{DS2}$ of the first transistor 52 and the second transistor 56 respectively. Similar voltage drops are observed in the reset process. To avoid the effect of $V_{DS3}$ and $V_{DS4}$, the sizes of the first p-type transistor 60, first n-type transistor 64, second p-type transistor 76, and second n-type transistor 80 have to be far larger than the first transistor 52 and the second transistor 56.

Figure 3:
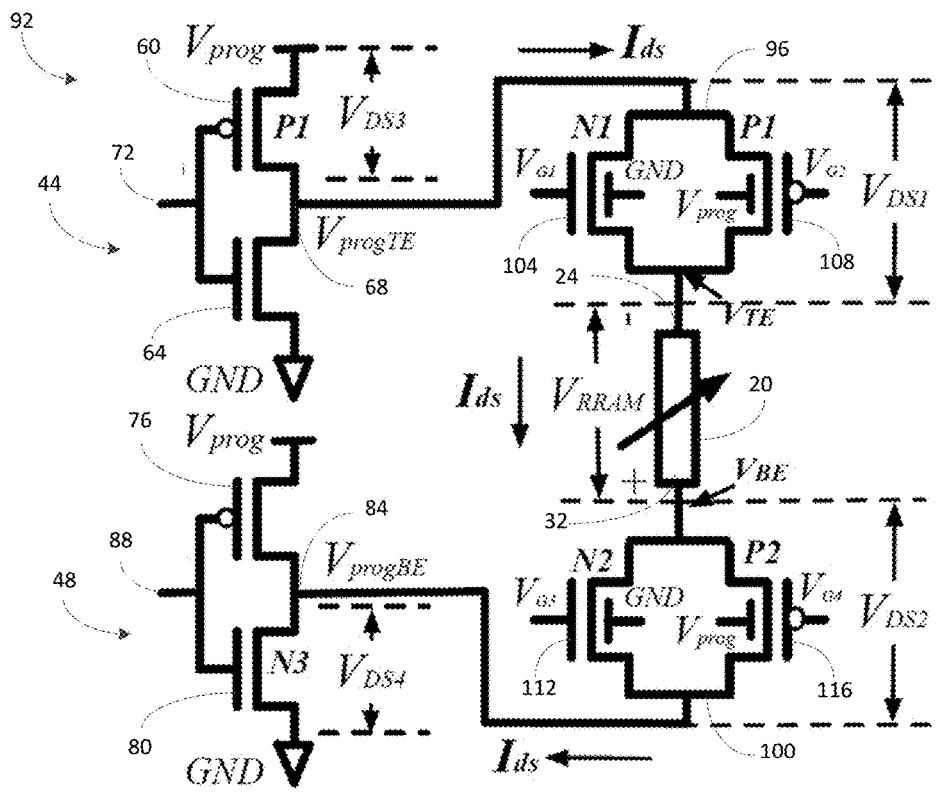
FIG. 3 illustrates a two transmission gates one RRAM based programming structure in accordance with some embodiments.

FIG. 3 illustrates a circuit design of a two transmission gate one RRAM (2TG1R) programming structure 92. The 2TG1R programming structure 92 is implemented similar to the 2T1R programming structure 40 except the first transistor 52 and the second transistor 56 are replaced with a first transmission gate 96 and a second transmission gate 100 respectively. The first transmission gate 96 includes a first gate n-type transistor 104 and a first gate p-type transistor 108 coupled in parallel to each other. The drains of the first gate n-type transistor 104 and the first gate p-type transistor 108 are coupled to the connection point 68 while the sources of the first gate n-type transistor 104 and the first gate p-type transistor 108 are coupled to the top electrode 24 of the RRAM 20. The first gate n-type transistor 104 and the first gate p-type transistor 108 are controlled by control signals $V_{G1}$ and $V_{G2}$ respectively. Similarly, the second transmission gate 100 includes a second gate n-type transistor 112 and a second gate p-type transistor 116 coupled in parallel to each other. The drains of the second gate n-type transistor 112 and the second gate p-type transistor 116 are coupled to the connection point 84 while the sources of the second gate n-type transistor 112 and the second gate p-type transistor 116 are coupled to the bottom electrode 32 of the RRAM 20. The second gate n-type transistor 112 and the second gate p-type transistor 116 are controlled by control signals $V_{G3}$ and $V_{G4}$ respectively. Accordingly, the 2TG1R programming structure 92 is formed by the two transmission gates, first transmission gate 96 and the second transmission gate 100, and one RRAM, RRAM 20. The 2TG1R programming structure 92 operates similar to the 2T1R programming structure 40 to set and reset the RRAM 20 with the first transmission gate 96 and the second transmission gate 100 both turned ON during the both the set and the reset processes.

The bulks of the first gate n-type transistor 104 and the second gate n-type transistor 112 are connected to the lowest potential and the bulks of the first gate p-type transistor 108 and the second gate p-type transistor 116 are connected to the highest potential. This removes the bulk leakage and body effects that may be caused by the first transistor 52 and the second transistor 56 of the 2T1R programming structure 40. Another advantage of the 2TG1R programming structure 92 is that the 2TG1R programming structure offers higher total current that the 2T1R programming structure 40.

Figure 4:
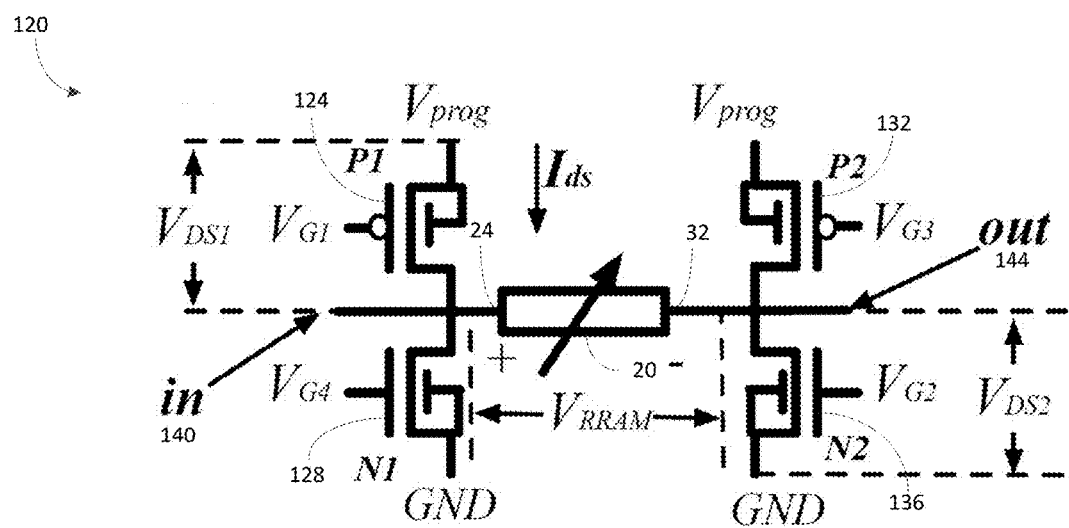
FIG. 4 illustrates a four transistors one RRAM based programming structure in accordance with some embodiments.

FIG. 4 illustrates a circuit design of a four transistor one RRAM (4T1R) programming structure 120. The 4T1R programming structure 120 includes a first p-type transistor 124, a first n-type transistor 128, a second p-type transistor 132, a second n-type transistor 136 and the RRAM 20. The sources of the programming transistors (that is, the first p-type transistor 124, the first n-type transistor 128, the second p-type transistor 132, and the second n-type transistor 136) are directly connected to the voltage supplies, eliminating the driving inverters 44 and 48 used in the 2T1R programming structure 40 and the 2TG1R programming structure 92. The first p-type transistor 124 is coupled between a positive power supply $V_{prog}$ and the top electrode 24 of the RRAM 20. The first p-type transistor 124 is controlled by a control signal $V_{G1}$, which is inverted before being provided to the first p-type transistor 124. The first n-type transistor 128 is coupled between the top electrode 24 of the RRAM 20 and ground GND. The first n-type transistor 128 is controlled by a control signal $V_{G4}$. The second p-type transistor 132 is coupled between the positive power supply $V_{prog}$ and the bottom electrode 32 of the RRAM 20. The second p-type transistor 132 is controlled by a control signal $V_{G3}$, which is inverted before being provided to the second p-type transistor 132. The second n-type transistor 136 is coupled between the bottom electrode 32 of the RRAM 20 and ground GND. The second n-type transistor 136 is controlled by a control signal $V_{G2}$.

In a set process, the first p-type transistor 124 (that is, a first transistor) and the second n-type 136 (that is, a fourth transistor) are turned ON, while the first n-type transistor 128 (that is, a second transistor) and the second p-type transistor 132 (that is, a third transistor) are turned OFF. Accordingly, a positive programming voltage $V_{set}$ is provided across the top electrode 24 and the bottom electrode 32 of the RRAM 20. In a reset process, the first n-type transistor 128 (that is, a second transistor) and the second p-type transistor 132 (that is, a third transistor) are turned ON, while the first p-type transistor 124 (that is, a first transistor) and the second n-type 136 (that is, a fourth transistor) are turned OFF. Accordingly, a negative programming voltage $V_{reset}$ is provided across the top electrode 24 and the bottom electrode 32 of the RRAM 20.

The 4T1R programming structure 120 offers several advantages to the 2T1R programming structure 40 and the 2TG1R programming structure 92. The driving strength of the programming transistors is higher in the 4T1R programming structure 120. Since the set and reset processes use separated transistors, transistor sizes in 4T1R programming structure 120 can be more flexible than 2T1R programming structure 40 or 2TG1R programming structure 92, leading to better area efficiency. Drain/Source of programming transistors are directly connected to voltage supplies, eliminating driving inverters in the 4T1R programming structure 120. The bulk connections in the 4T1R programming structure may follow the common digital practice and therefore avoid leakage currents.

Additional comparison between the programming structures is described in detail in the publication titled "A STUDY ON THE PROGRAMMING STRUCTURES FOR RRAM-BASED FPGA ARCHITECTURE" published in IEEE Transaction on Circuits and Systems I (TCAS-I): Regular Papers, Vol. 63, No. 4, 2016, pp. 503-516, the entire contents of which are hereby incorporated by reference.

When the RRAM 20 is programmed in a Low Resistance State, the RRAM 20 propagates signals within the datapath. That is, the RRAM 20 allows the signal from an input 140 to pass through to the output 144. When the RRAM 20 is programmed in a High Resistance State, the RRAM 20 blocks signals in the datapath. That is, the RRAM 20 blocks the signal from the input 140 from passing through to the output 144.

In some embodiments, the programming transistors used in the 2T1R programming structure 40, the 2TG1R programming structure 92, and the 4T1R programming structure 120 are input/output transistors having a width of approximately 320 nano-meters [nm] and a length of approximately 270 nm. The $V_{GS}$ and $V_{DS}$ characteristics of the programming transistors may be approximately 2.5 V, with the programming transistors capable of being overdriven to approximately 3 V. The ratio between p-type and n-type programming transistors β may be set to 3. In some embodiments, logic transistors rather than or in combination with input/output transistors may also be used.

SRAM-based FPGAs depend on scan chains and/or memory banks to configure all the SRAM bits. Scan chains consist of cascaded flip-flops, whose outputs are connected to gates of pass transistors. A programming bit stream is loaded into the chain by applying n clock cycle, with n being the number of stages. The 4T1R programming structure 120 is also compatible with the scan chain organizations.

Figure 5:
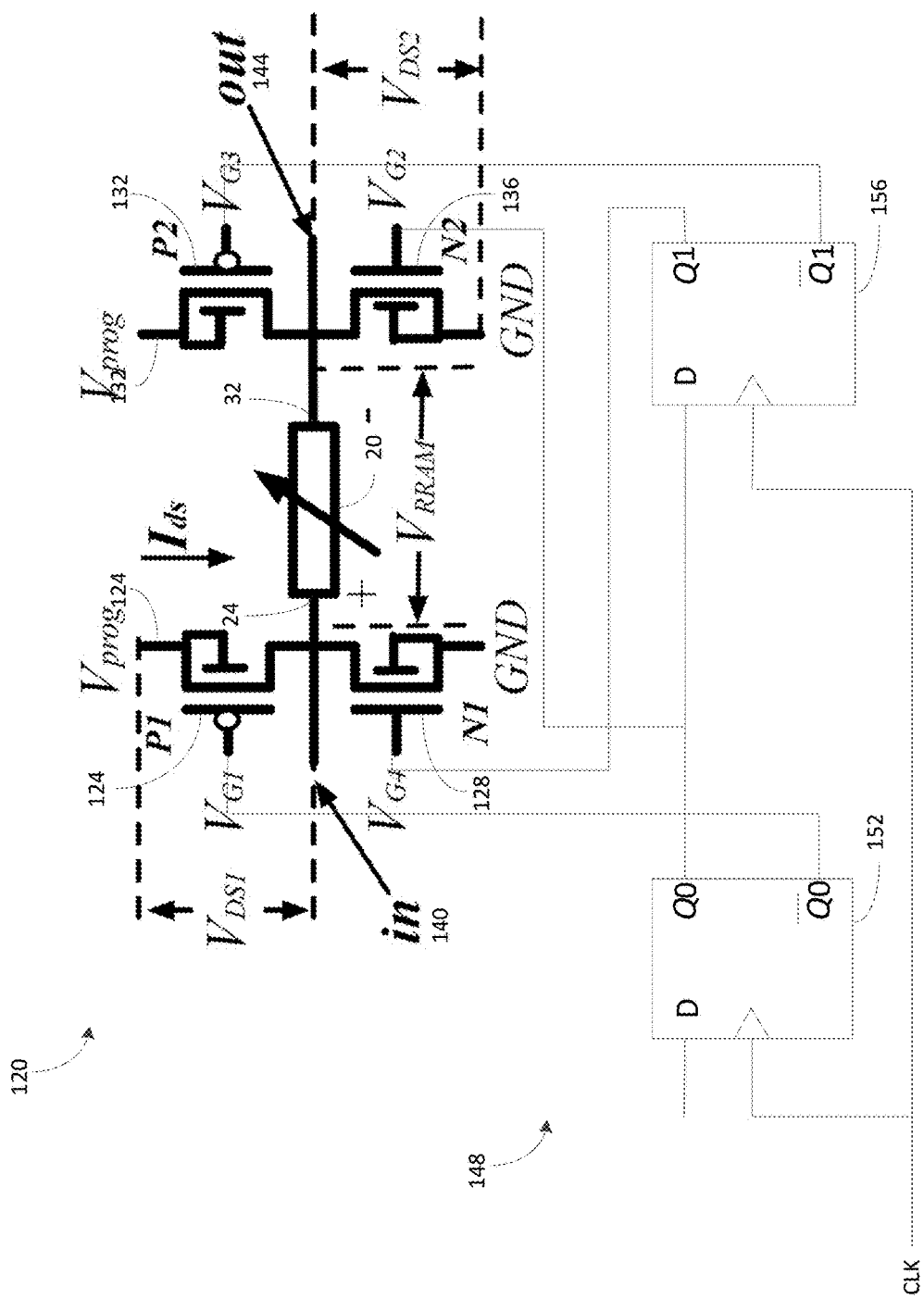
FIG. 5 illustrates a scan chain organization in accordance with some embodiments.

FIG. 5 illustrates a scan chain organization 148 for configuring the 4T1R programming structure 120. The scan chain organization 148 includes a first flip-flop 152 and a second flip-flop 156. The first flip-flop 152 receives an input from a programming bit stream (not shown) and provides an output Q0. The second flip-flop 156 receives output Q0 of the first flip-flop 152 as an input and provides an output Q1. The output Q0 of the first flip-flop 152 is provided as the control signal $V_{G2}$ to the second n-type transistor 136. The inverted output Q0' of the first flip-flop 152 is provided as the control signal $V_{G1}$ to the first p-type transistor 124. The output Q1 of the second flip-flop 156 is provided as the control signal $V_{G4}$ to the first n-type transistor 128. The inverted output Q1' of the second flip-flop 156 is provided as the control signal $V_{G2}$ to the second p-type transistor 132. FIG. 5 illustrates only one example of a scan chain organization for one RRAM 20. One or ordinary skill in the art would appreciate that an FPGA may include a plurality of flip-flops to program a plurality of RRAMs 20. The plurality of flip-flops are sequentially connected to each other in the scan chain organization. For example, a third flip-flop may be coupled to receive the output Q1 of the second flip-flop 156 and a fourth flip-flop coupled to receive an output Q2 of the third flip flop. The third flip-flop and the fourth flip-flop may be used to program a second RRAM 20. As described above, a bit stream is fed into the first flip-flop 152 to configure the plurality of RRAMs 20.

The outputs Q0 and Q1 are configured as logical highs (1s) and logical lows (0s). For example, the logical high signal corresponds to the voltage level signal at which the programming transistor receiving the output is turned ON and the logical low signal corresponds to a zero voltage signal such that the programming transistor receiving the output is turned OFF.

Figure 6:
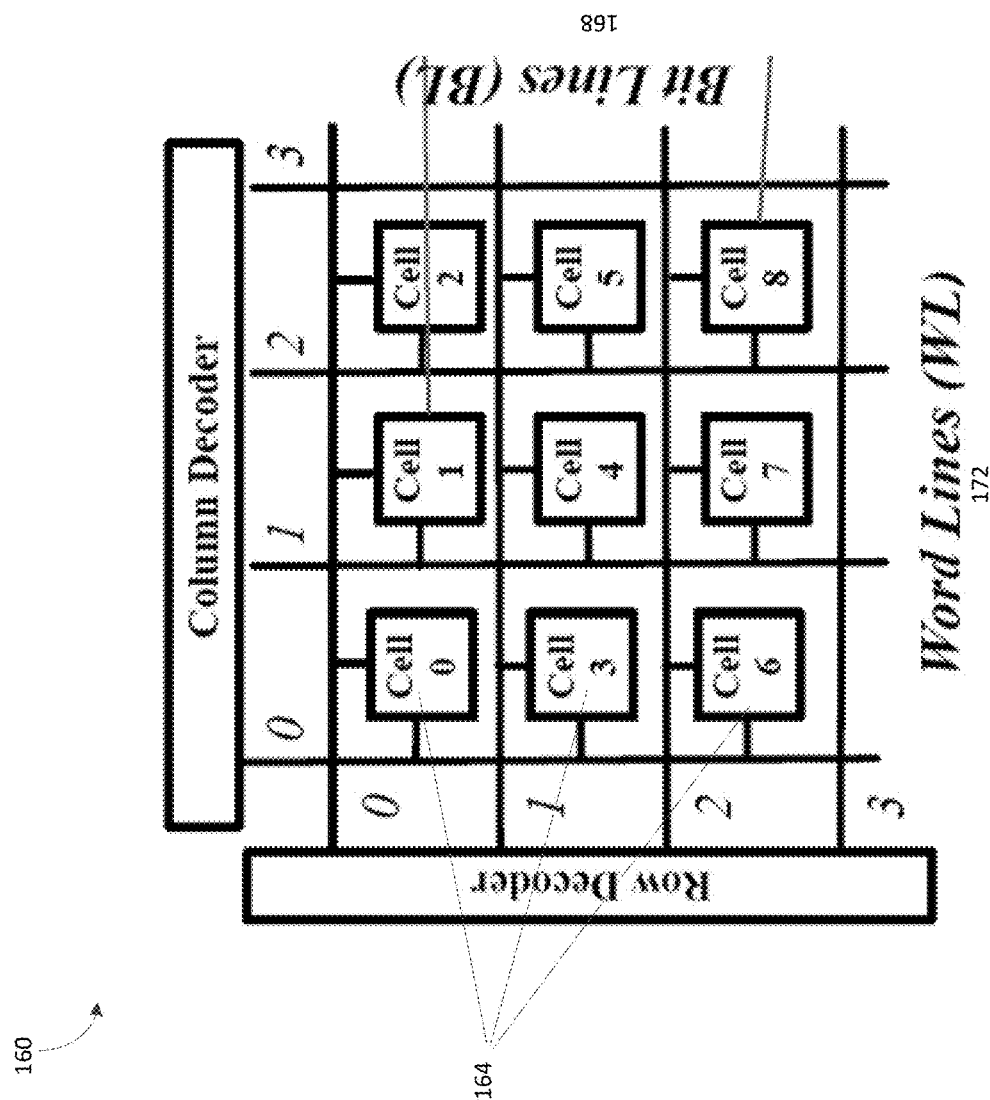
FIG. 6 illustrates a memory bank organization in accordance with some embodiments.

FIG. 6 illustrates a memory bank organization 160 for configuring the 4T1R programming structure 120. The memory bank organization 160 includes a plurality of cells 164 providing configurations bits over a plurality of bit lines 168 and a plurality of word lines 172. The word lines and bit lines are coupled to control signals of the transistors of the 4T1R programming structure to program the RRAM 20. In one example, cell[1] and cell[8] are used to program the RRAM 20 in the 4T1R programming structure. In this example, BL[0]' is coupled to the control signal $V_{G1}$, WL[0] is coupled to the control signal $V_{G2}$, BL[2]' is coupled to the control signal $V_{G3}$, and WL[2] is coupled to the control signal $V_{G4}$. Similarly, other cells may be used to program other RRAMs 20 of the FPGA. A bit stream may be loaded into the cells 164 of the memory bank 160 to configure the plurality of RRAMs 20.

The cells 164 are configured to store logical highs (1s) and logical lows (0s). For example, the logical high signal corresponds to the voltage level signal at which the programming transistor receiving the output is turned ON and the logical low signal corresponds to a zero voltage signal such that the programming transistor receiving the output is turned OFF.

As described above, RRAMs 20 can also be used to replace pass-transistors or transmission gates in the multiplexers with different structures. When the RRAM 20 is programmed to Low Resistance State, the RRAM 20 can propagate signals as a pass-transistor or transmission gate in ON state would do. When the RRAM 20 is programmed to High Resistance State, the RRAM 20 can block signals as a pass-transistor or transmission gate in an OFF state. The RRAM 20 also introduces a parasitic capacitance, however the parasitic capacitance is much smaller than a CMOS transistor resulting in a more pronounced non-linearity. With the reduction of parasitic capacitance and a smaller equivalent resistance than transistors, RRAMs can significantly improve the delay and power of multiplexers. The 4T1R programming structure 120 can also be used to configure the RRAMs 20 in a multiplexer. In order to drive the set and reset currents for configuring the RRAMs, the programming voltage $V_{prog}$ should be high enough to overcome the $V_{set}$ and $V_{reset}$ thresholds and is also potentially larger than the datapath signals. In physical design, a deep N-well is used to provide a different voltage domain for the 4T1R programming structure 120.

Figure 7:
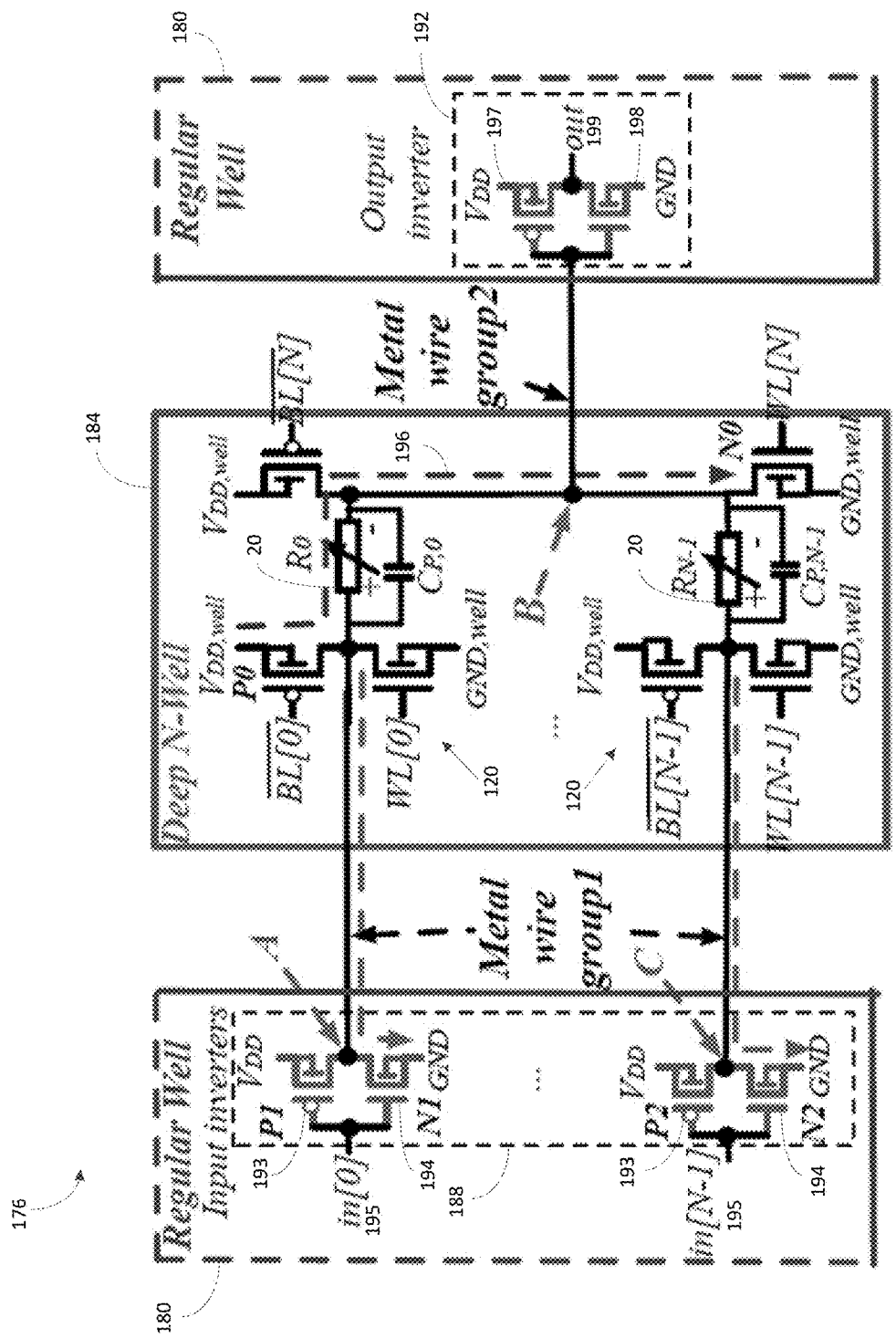
FIG. 7 illustrates a four transistors one RRAM based multiplexer in accordance with some embodiments.

FIG. 7 illustrates a 4T1R based multiplexer 176 according to a first embodiment that can be programmed with the 4T1R programming structure 120 as described above. The 4T1R based multiplexer 176 is a one-level N:1 multiplexer. The 4T1R based multiplexer 176 includes a regular well 180 and a deep N-well 184. For simplification, the regular well 180 is shown as split into two wells, however, the physical design may include only a single regular well. A plurality of input inverters 188 and an output inverter 192 are provided on the regular well 180. The plurality of RRAMs 20 and the corresponding transistors of the 4T1R programming structures 120 are provided in the deep N-well. In the example illustrated, the 4T1R based multiplexer 176 includes N pairs of 4T1R programming structures 120, which are controlled by N+1 bit lines and N+1 word lines. All RRAMs 20 share a pair of programming transistors at node B. By sharing the pair of programming transistors at node B, the size and parasitic capacitance from transistors can significantly be reduced.

The plurality of RRAMs 20 can be programmed in series. For example, when a set process is required for RRAM R0, control signals BL[0]' and WL[N] are enabled. Programming transistors P0 and N0 are turned ON and drive a programming current 196 flowing through RRAM R0. Other programming transistors are turned OFF during the programming period.

Each input inverter 188 includes a first input transistor 193, a second input transistor 194, and an input 195 (for example, a plurality of multiplexer inputs). The drain of the first input transistor 193 is coupled to the positive power supply $V_{DD}$ and the source of the second input transistor 194 is coupled to GND. The source of the first input transistor 193 and the drain of second input transistor 194 are coupled to each other at connection point A. The first input transistor 193 and the second input transistor 194 are controlled by the input 195. The input 195 is configured to be a logical high (1) or a logical low (0). For example, the logical high signal corresponds to the voltage level signal (e.g., $V_{DD}$) at which the input transistors 193 and 194 receiving the input 195 are turned ON and the logical low signal corresponds to a zero voltage signal such that the input transistors 193 and 194 receiving the input 195 are turned OFF. The input 195 is provided directly to the second input transistor 194, but the input 195 is inverted before being provided to the first input transistor 193. Accordingly, when the input 195 is logical high, the first input transistor 193 is turned OFF and the second input transistor 194 is turned ON. Similarly, when the input 195 is logical low, the first input transistor 193 is turned ON and the second input transistor 194 is turned OFF.

The output inverter 192 includes a first output transistor 197, a second output transistor 198, and an output 199. The drain of the first output transistor 197 is coupled to the positive power supply $V_{DD}$ and the source of the second output transistor 198 is coupled to GND. The source of the first output transistor 197 and the drain of second output transistor 198 are coupled to each other at the output 199. The first output transistor 197 and the second output transistor 198 are controlled by a signal received from the RRAMs 20 at node B. The control signal from node B is the signal received from a selected input of the plurality of inputs 195 and is configured to be a logical high (1) or a logical low (0). The control signal from node B is provided directly to the second output transistor 198, but the control signal from node B is inverted before being provided to the first output transistor 197. Accordingly, when the control signal from node B is logical high, the first output transistor 197 is turned OFF and the second output transistor 198 is turned ON. Similarly, when the control signal from node B is logical low, the first output transistor 197 is turned ON and the second output transistor 198 is turned OFF. As a consequence, the 4T1R based multiplexer 176 propagates the signal from the selected input 195 to the output 199.

Figure 8:
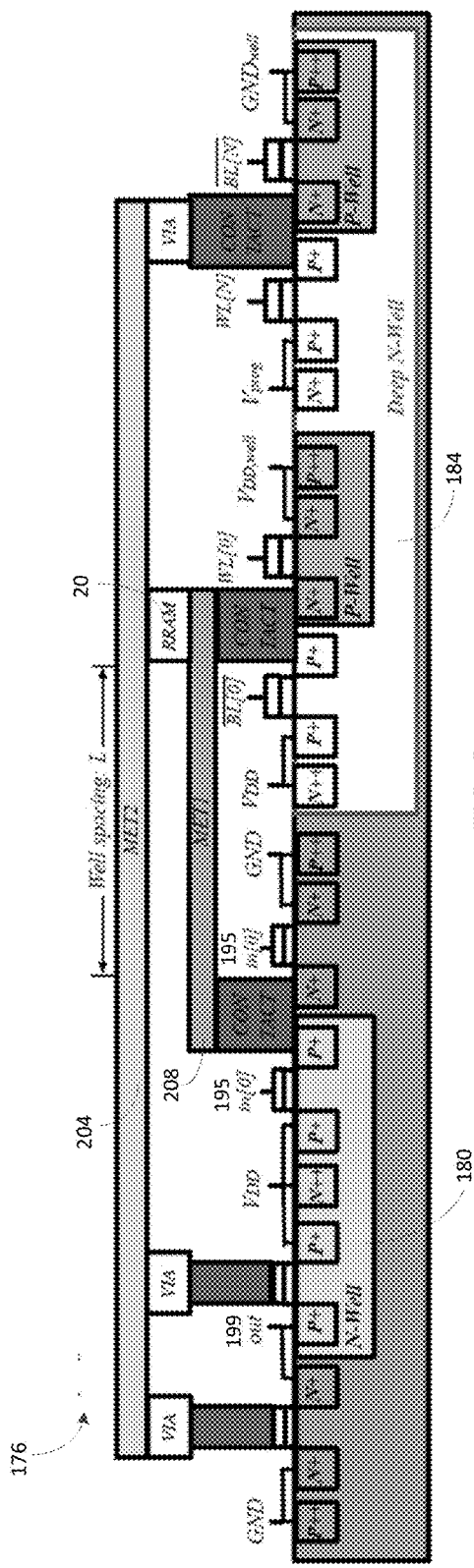
FIG. 8 illustrates a layout of the four transistors one RRAM based multiplexer of FIG. 7 in accordance with some embodiments.

FIG. 8 illustrates a cross-section of the physical layout of the 4T1R based multiplexer 176. FIG. 8 illustrates an input inverter in[0] 188, the output inverter 192 and a single 4T1R programming structure 120. Input inverters 188 and output inverter 192 can be accommodated with a regular N-well 180, so as to be more area efficient. However, when the regular N-well is shared, long metal wires 204 and 208 are used to accommodate the large space between the regular N-well 180 and the deep N-well 184 for the interconnections between the datapath logics and the programming structures.

Figure 9A:
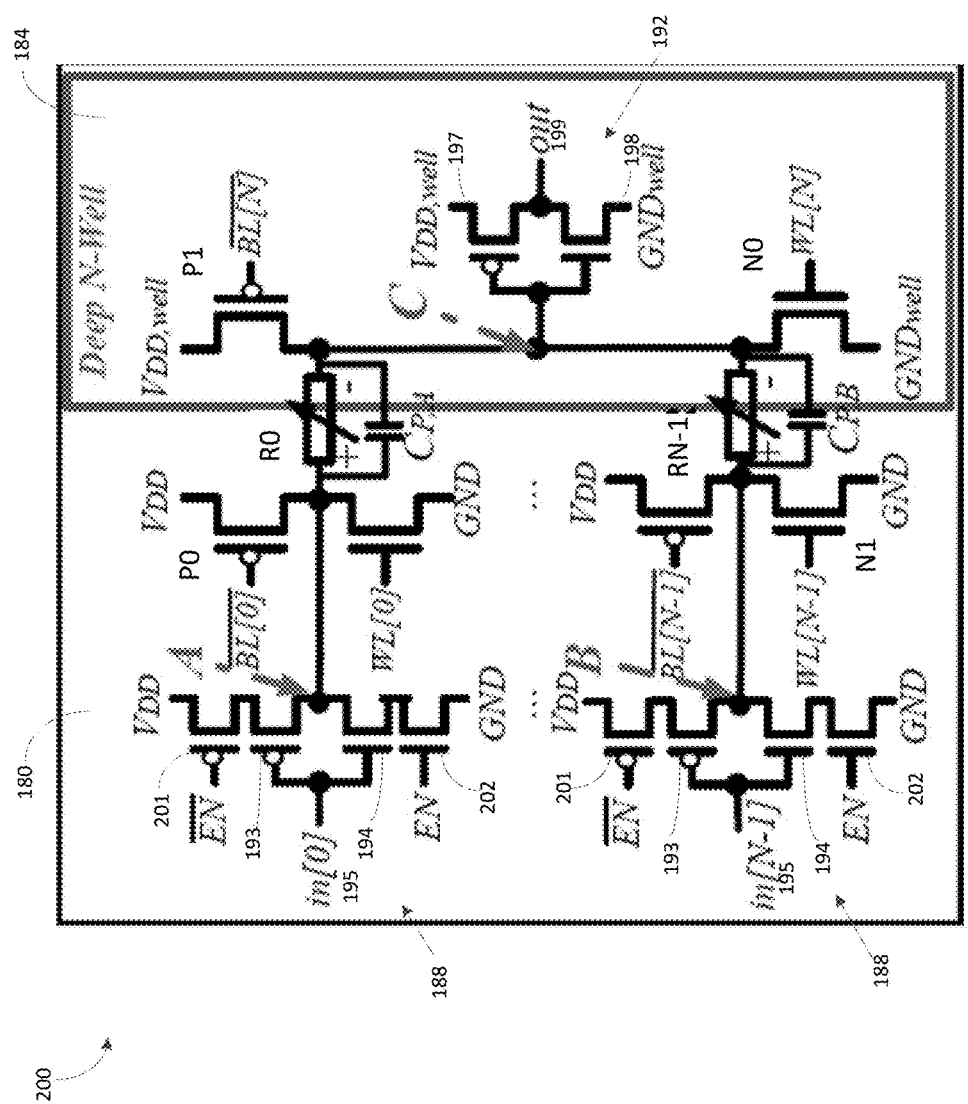
FIGS. 9A-9C illustrate a four transistors one RRAM based multiplexer and operation modes of the four transistors one RRAM based multiplexer in accordance with some embodiments.
Figure 9B:
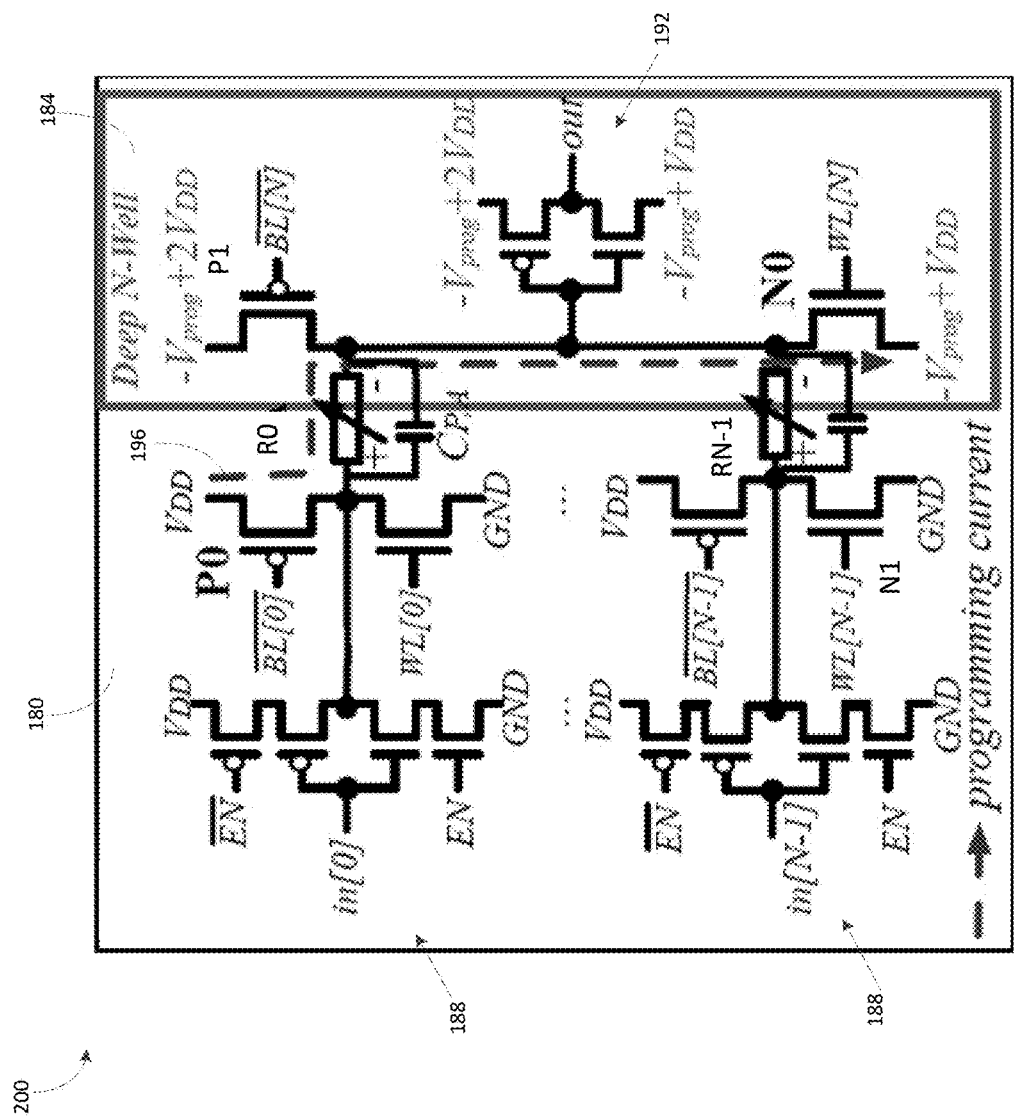
Figure 9C:
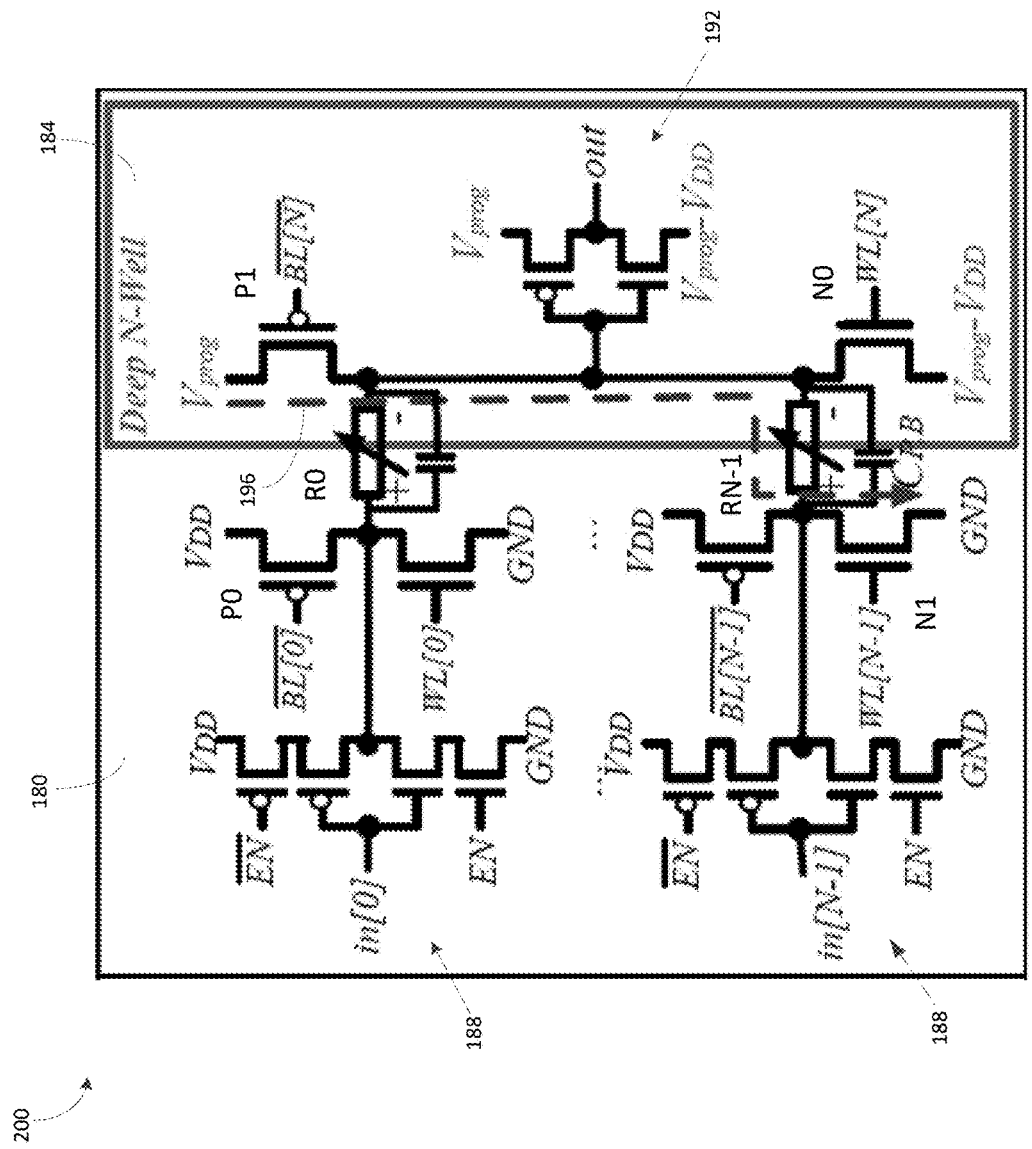

FIGS. 9A-9C illustrate a 4T1R based multiplexer 200 according to a second embodiment. Like elements from FIG. 7 are referenced by like numerals. The 4T1R based multiplexer 200 is different from the 4T1R based multiplexer in two aspects: (a) the plurality of input inverters 188 are power gated; and (b) the programming transistors and the output inverter 192 are organized in different domains (that is, wells). The input inverters 188 and part of the 4T1R programming structure 120 are driven by a constant voltage domain $V_{DD}$ and GND. In other words, a constant voltage domain (for example, a first voltage domain) provides a power supply to a plurality of first driving elements and the input inverters 188. The plurality of first driving elements includes the p-type programming transistors and the n-type programming transistors coupled to the top electrode 24 of each RRAM 20 in the 4T1R based multiplexer 200. The output inverter 192 and the rest of the 4T1R programming structure 120 are driven by a switchable voltage supplies $V_{DD,well}$ and $GND_{well}$. In other words, a switchable voltage supply (for example, a second voltage domain) provides a power supply to second driving element and the output inverter 192. The second driving element includes the p-type transistor P1 and the n-type transistor N0 coupled to the bottom electrodes 32 of each RRAM 20 in the 4T1R based multiplexer 200. In some embodiments, based on the placement of the first plurality of driving elements and the second driving element, the switchable voltage supply provides a power supply to the plurality of first driving elements and the input inverters 188, while the constant voltage domain provides a power supply to second driving element and the output inverter 192. In some embodiments, the plurality of first driving elements and the second driving element are controlled by a scan chain organization including one or more flip-flops. In other embodiments, the plurality of first driving elements and the second driving element are controlled by a memory bank organization including one or more bit lines and one or more word lines coupled to the plurality of first driving elements and the second driving element.

The input inverters 188 include the first input transistor 193, the second input transistor 194, a first gate transistor 201, and a second gate transistor 202. The first gate transistor 201 is coupled between the positive voltage supply and the first input transistor 193. The second gate transistor 202 is coupled between the second input transistor 194 and GND. The first gate transistor 201 and the second gate transistor 202 are controlled by an enable EN signal. The first gate transistor 201 and the second gate transistors 202 are controlled by the enable EN signal to turn OFF during a programming phase of the 4T1R based multiplexer 200 to prevent cross talk and leakage current between the input transistors 193 and 194 and the programming transistors.

During multiplexing operation (that is, non-programming operation), the switchable voltage supplies $V_{DD,well}$ and $GND_{well}$ are configured to be equal to the constant voltage domain $V_{DD}$ and GND. RRAM 20 programming voltages are generally selected to be larger than $V_{DD}$ to ensure that RRAMs 20 are not parasitically programmed during multiplexing operation. When a set operation is triggered, input inverters 188 are disabled by turning OFF the first gate transistors 201 and the second gate transistors 202 and $V_{DD,well}$ and $GND_{well}$ are switched to be $-V_{prog}+2V_{DD}$ and $-V_{prog}+V_{DD}$ respectively (as shown in FIG. 9B). As a consequence, the voltage across the top electrodes 24 and the bottom electrodes 32 of the RRAMs 20 is the set programming voltage $V_{prog}$. When a reset operation is triggered, the input inverters 188 are disabled, and $V_{DD,well}$ and $GND_{well}$ are switched to be $V_{prog}$ and $V_{prog}-V_{DD}$ respectively (as shown in FIG. 9C). As a consequence, the voltage across the top electrodes 24 and the bottom electrodes 32 of the RRAMs 20 is the reset programming voltage $-V_{prog}$. Accordingly, the voltage difference across the RRAMs 20 is $+/-V_{prog}$ and the working principle of the 4T1R structure is maintained.

FIG. 9B illustrates a method of programming the first RRAM R0 into the Low Resistance State. The switchable power supplies $V_{DD,well}$ and $GND_{well}$ are switched to $-V_{prog}+2V_{DD}$ and $-V_{prog}+V_{DD}$ respectively. The programming transistors P0 and N0 are turned ON using control signals received from BL[0]' and WL[N]. All the other programming transistors are turned OFF. Additionally, the first gate transistors 201 and the second gate transistors 202 are also turned OFF to prevent cross talk between the input transistor 193 and 194 and the programming transistors. The programming current 196 flows from the constant power supply $V_{DD}$ through the first driving element P0, the first RRAM R0, the second driving element N0 and to the switchable voltage supply $GND_{well}$ (switched to $-V_{prog}+V_{dd}$).

FIG. 9C illustrates a method of programming the first RRAM $R_{N-1}$ into the High Resistance State. The switchable power supplies $V_{DD,well}$ and $GND_{well}$ are switched to $V_{prog}$ and $V_{prog}-V_{DD}$ respectively. The programming transistors P1 and N1 are turned ON using control signals received from BL[N]' and WL[N-1]. All the other programming transistors are turned OFF. Additionally, the first gate transistors 201 and the second gate transistors 202 are also turned OFF to prevent cross talk between the input transistor 193 and 194 and the programming transistors. The programming current flows from the switchable power supply $V_{DD,well}$ (switched to $V_{prog}$) through the second driving element P1, the first RRAM R0, the first driving element N1 and to the constant voltage supply GND.

In the 4T1R based multiplexer 200, the voltage drop across each datapath transistor can be limited to $V_{DD}$, allowing the use of logic transistors instead of input/output transistors. Logic transistors occupy less area and introduce less capacitances than input/output transistors, potentially improving the footprint and delay of RRAM based multiplexers. During the set and reset processes, the voltage drop of each transistor can be boosted from $V_{DD}$ to $V_{DD,max}$, approaching the maximum reliable voltage without breakdown limitation. Boosted $V_{DD,max}$ leads to higher current density driven by transistors, further contributing to lower $R_{LRS}$. The set and reset processes require short amount of time, that is, typically 200 ns for each RRAM. Since programming does not occur many times, very low stress is applied on the transistors, further contributing to robust operation.

The sizing of programming transistors can impact the delay of RRAM-based multiplexers. Programming transistors having three fins lead to lower achievable RRAM resistances than one or two fins, which, in turn, perform better in driving the large parasitic capacitances of long metal wires.

Figure 10:
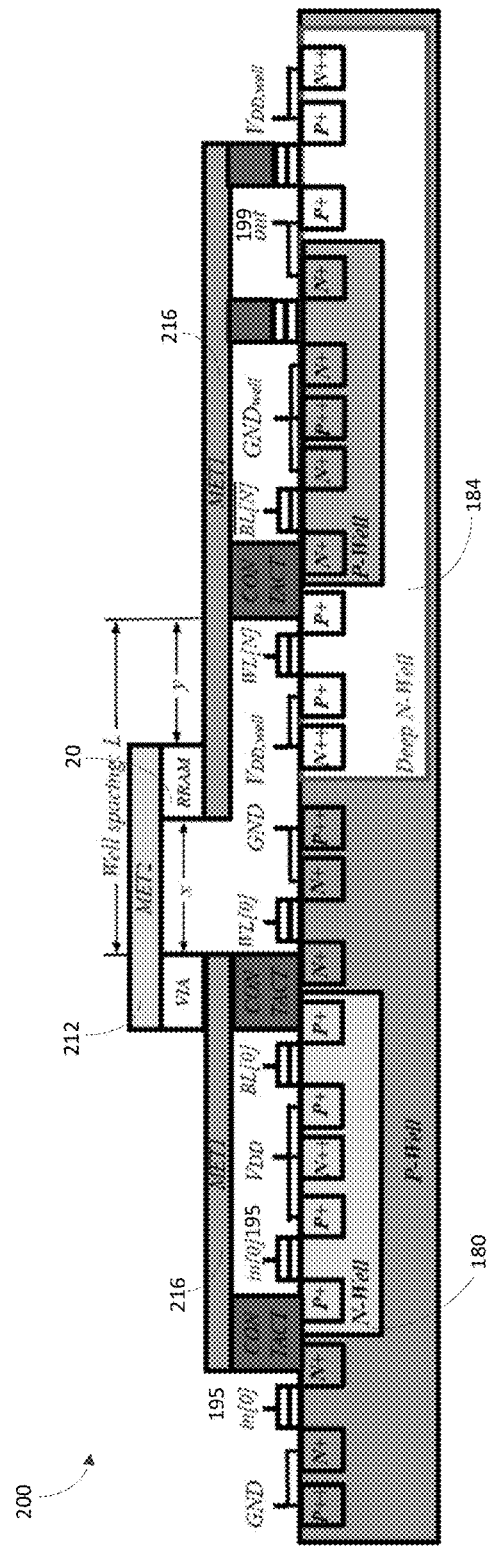
FIG. 10 illustrates a layout of the four transistors one RRAM based multiplexer of FIG. 8 in accordance with some embodiments.

During set and reset processes, the programming voltage $V_{prog}$ is determined by the source-to-drain voltage drop $V_{DS}$ across the programming transistors and the programming threshold voltage of the RRAMs. The $V_{DS}$ of the programming transistors should be large enough to drive sufficient programming current, but should also be selected under the breakdown conditions. Therefore, the $V_{prog}$ may be selected to be less than $2V_{DD,max}$. In some embodiments, the voltage $V_{DD}$ is approximately 0.7 V, $V_{DD,max}$ is approximately 0.9 V, and $V_{prog}$ approximately 1.8 V. In some embodiments, a nominal value of $V_{DD}$ is between 0.7-1V and a nominal value of $V_{prog}$ is 2.5-3.5V FIG. 10 illustrates a cross-section of the physical layout of the 4T1R based multiplexer 200. FIG. 10 illustrates an input inverter in[0] 188, the output inverter 192 and a single 4T1R programming structure. The 4T1R based multiplexer 200 includes only one group of long interconnecting wires 212, which reduces parasitics from metal wires. RRAMs 20 can be fabricated between metal lines 212 and 216, and hence may be located in any position between the two wells 180 and 184. In one embodiment, the RRAM 20 is located close to the N-well. Whatever location the RRAM 20 is, there is only one long metal wire 212 across the two wells 180 and 184, while the other metal wires 216 connect transistors inside the same well.

Figure 11:
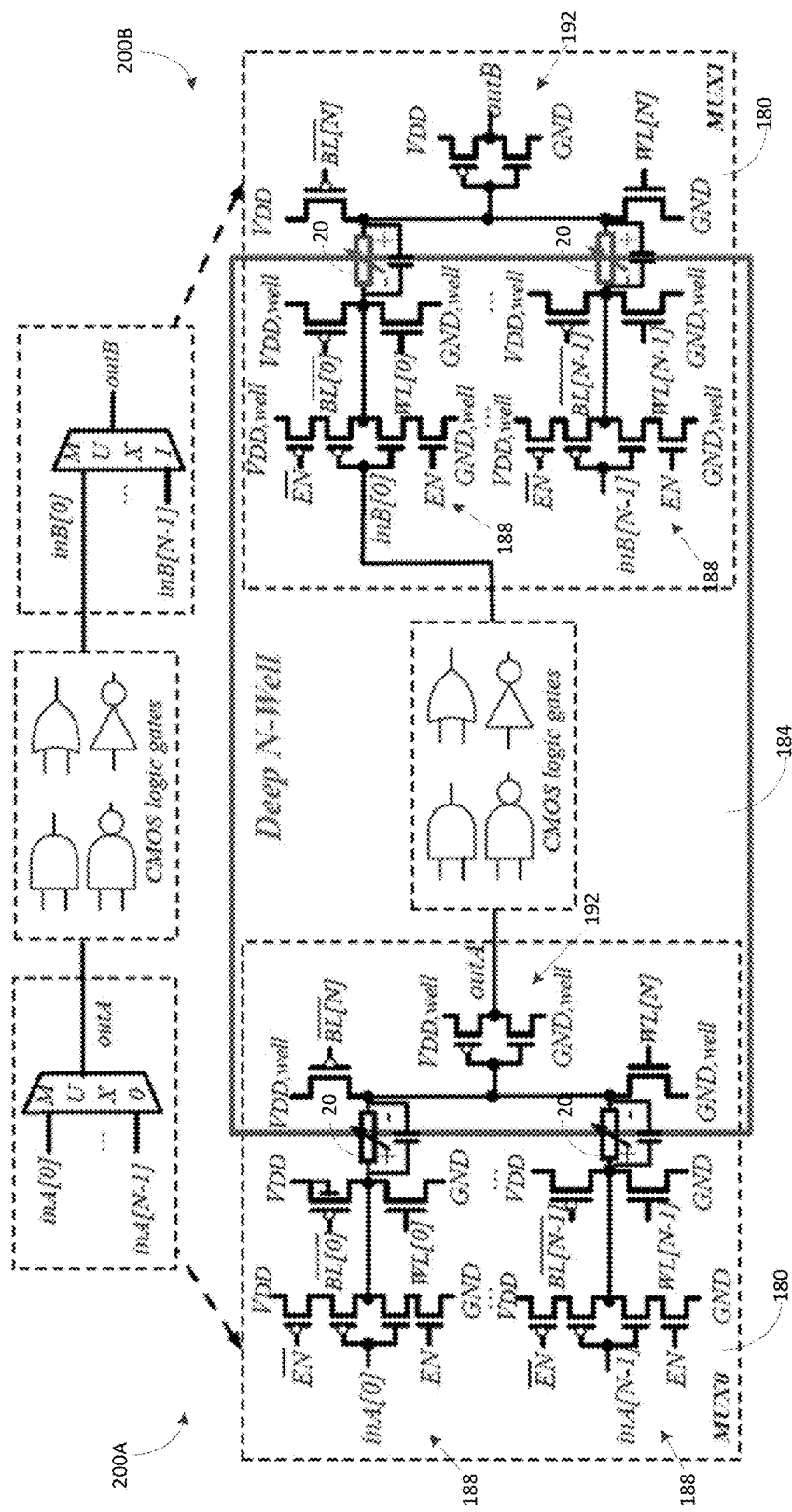
FIG. 11 illustrates a shared Deep N-Well layout of the four transistors one RRAM based multiplexer of FIG. 8 in accordance with some embodiments.

Referring to FIG. 11, two cascaded 4T1R based multiplexers 200 (that is, a first 4T1R based multiplexer 200A and a second 4T1R based multiplexer 200B) may share a single deep N-well 184. The input inverters 188 and part of programming structure (that is, the first driving elements) of the second 4T1R based multiplexer 200B can share the deep N-well 184 with the output inverter 192 and part of the programming structures (that is, the second driving element) of the first 4T1R based multiplexer 200A. Note that the polarities of RRAMs 20 of the second 4T1R based multiplexer 200B are opposite to the polarities of the RRAMs 20 of the first 4T1R based multiplexer 200A. The second 4T1R based multiplexer 200B includes the constant voltage domain Vdd and GND providing a power supply to the second driving element and the output inverter 192, while the switchable power supply Vdd,well and GNDwell providing a power supply to the plurality of first driving elements and the input inverters 188. As a consequence, when a set or reset process is initiated in the first 4T1R based multiplexer 200A and the second 4T1R based multiplexer 200B, the switchable power supply Vdd,well and GNDwell is switched to the appropriate voltage supply for the set and reset processes to program the first 4T1R based multiplexer 200A and the second 4T1R based multiplexer 200B together.

Figure 12:
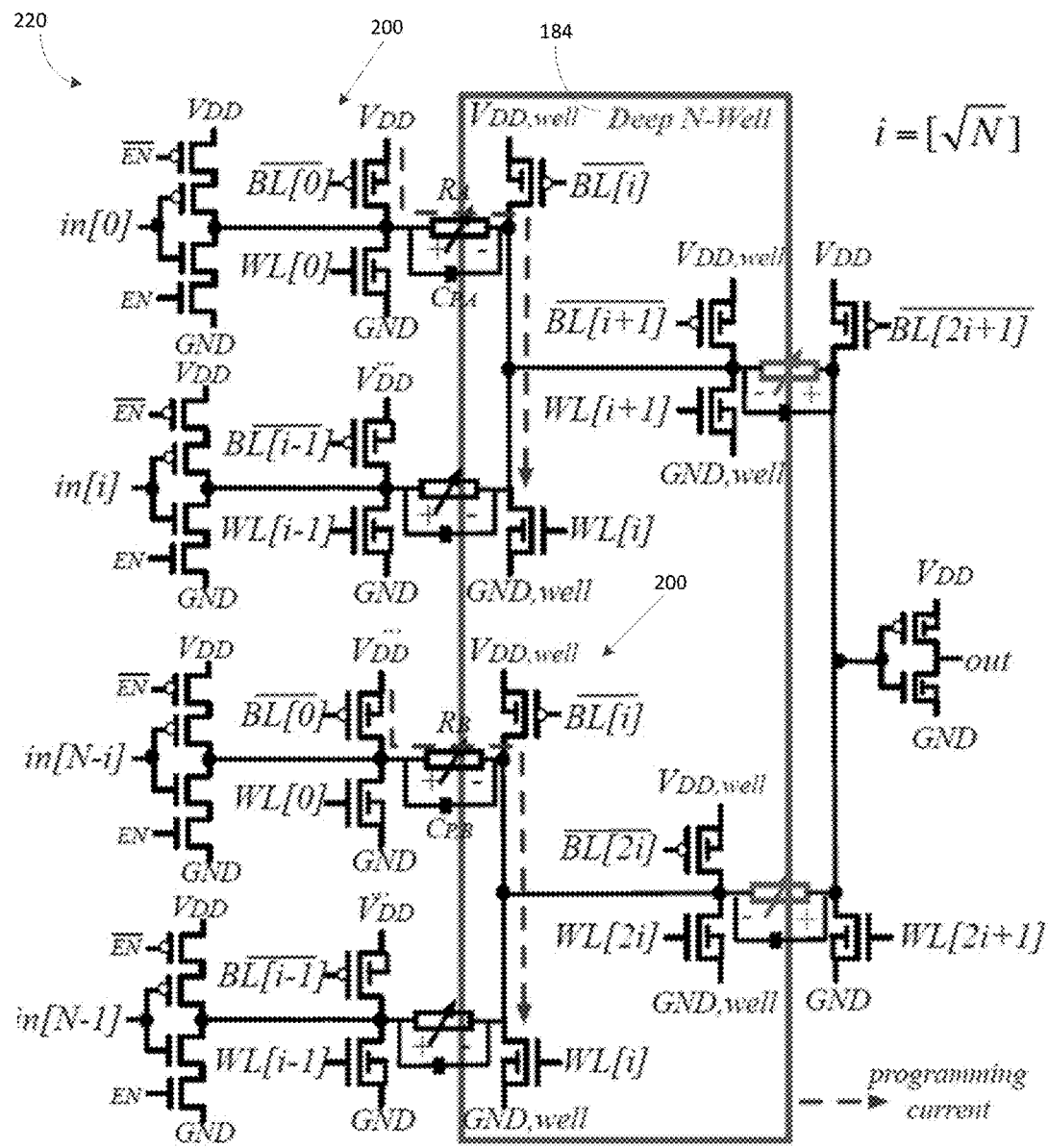
FIG. 12 illustrates a two-level N-input four transistors one RRAM based multiplexer in accordance with some embodiments.

FIG. 12 illustrates a two-level N-input 4T1R based multiplexer 220 including two one-level 4T1R based multiplexers 200 that form the first level and two 4T1R programming structures 120 that form the second level. A single deep N-well 184 may be used for both the 4T1R based multiplexers 200. In addition, the single deep N-well 184 may also be used for the second level of the two-level 4T1R based multiplexer 220. To simplify the programming strategies, as described above, the RRAMs 20 in the first level have opposite polarities than the RRAMs 20 in the second level. The 4T1R programming structures 120 belonging to the same level can share control lines, allowing RRAMs 20 to be programmed simultaneously. For example, the 4T1R programming structures from the top 4T1R based multiplexer 200 can be connected to bit lines BL[j]', 0<j<SQRT(N) and word lines WL[j], 0<j<SQRT(N), where SQRT( ) is the square root function. RRAMs 20 that are controlled by BL[0]' and WL[SQRT(N)], that is, RRAM RA and RRAM RB, can be programmed simultaneously similar to the control sharing in a CMOS multiplexer tree.

Figure 13:
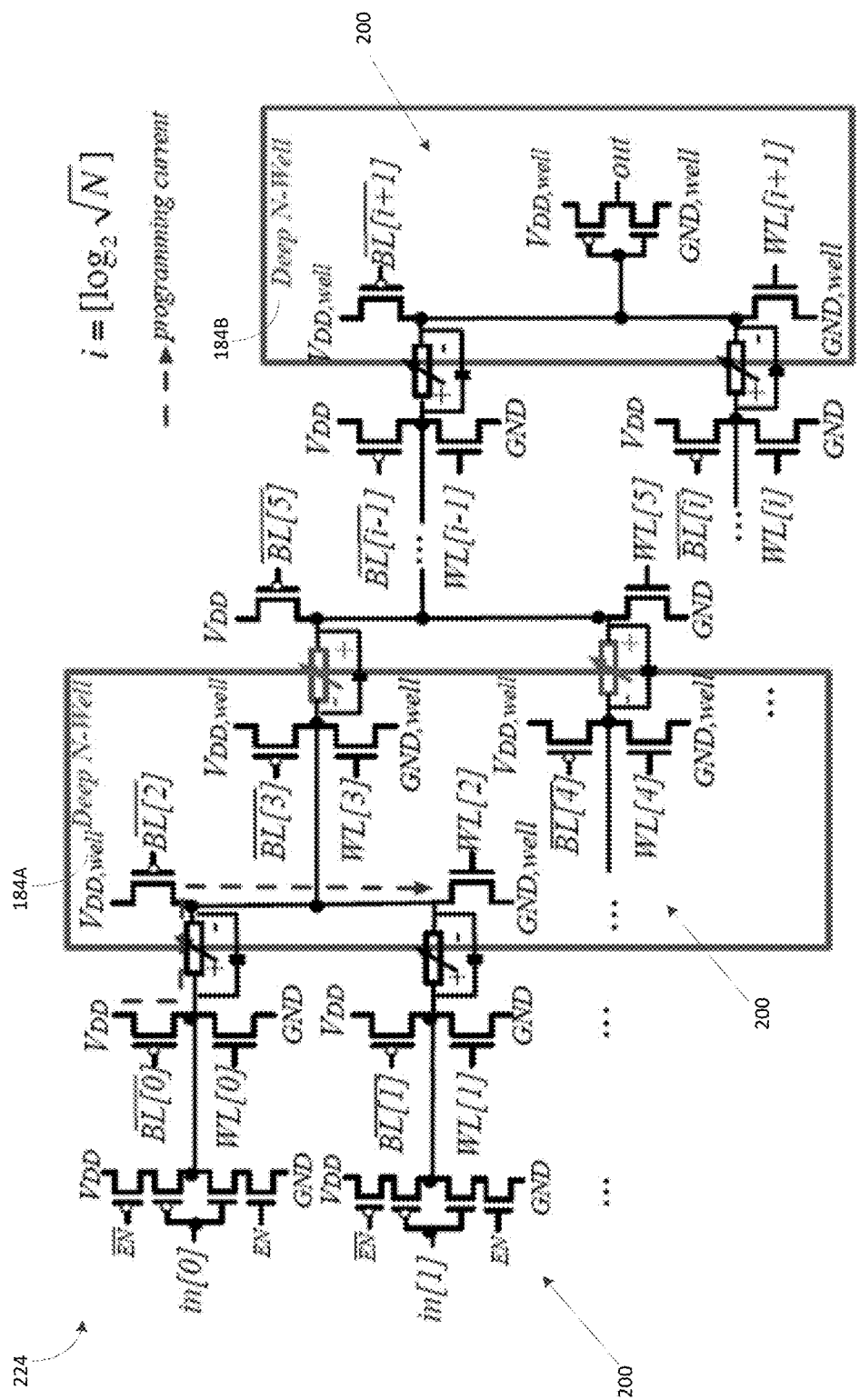
FIG. 13 illustrates a tree-like N-input four transistors one RRAM based multiplexer in accordance with some embodiments.

FIG. 13 illustrates a tree-like N-input 4T1R based multiplexer 224 including a plurality of one-level 4T1R based multiplexers 200 that form a plurality of levels. A first deep N-well 184A may be used for a plurality of the 4T1R based multiplexers 200 in the first level. In addition, the first deep N-well 184A may also be shared with the plurality of 4T1R based multiplexers 200 of the second level. Similarly, the second deep N-well 184B may be shared between the third level and fourth level of 4T1R based multiplexers 200. To simplify the programming strategies, as described above, the RRAMs 20 in the even levels have opposite polarities than the RRAMs 20 in the odd level. The 4T1R programming structures 120 belonging to the same level can share control lines, allowing RRAMs 20 to be programmed simultaneously.

Further comparison between the different RRAM-based multiplexer structures is provided in the publication titled "CIRCUIT DESIGNS OF HIGH-PERFORMANCE AND LOW-POWER RRAM-BASED MULTIPLEXERS BASED ON 4T(RANSISTOR)1R(RAM) PROGRAMMING STRUCTURE" published in IEEE Transaction on Circuits and Systems I (TCAS-I): Regular Papers, Vol. 64, No. 5, 2017, pp. 1173-1186, and in the publication titled "PHYSICAL DESIGN CONSIDERATIONS OF ONE-LEVEL RRAM-BASED ROUTING MULTIPLEXERS" published in proceedings of the 2017 ACM on International Symposium on Physical Design pp. 47-54, the entire contents of which are hereby incorporated by reference.

RRAM-based FPGAs provide several advantages over SRAM-based FPGAs. When employed at nominal supply voltage, RRAM-based FPGAs can reduce the area footprint by 7-15%, increase performance by 45-58%, and reduce power consumption by 20-58%. Additionally, compared to transmission gates, the resistance values of RRAMs do not degrade when the operating voltage decreases. By using proper programing transistor sizing technicque and operating in the near-$V_t$ regime, RRAM-based FPGAs can achieve 20% area saving, 10% performance gain and 65% power reduction compared to SRAM-based FPGAs.

RRAM-based multiplexers provide several advantages over CMOS multiplexers. At nominal working voltage, considering an input size ranging from 2 to 32, the improved 4T1R-based multiplexers outperform the best CMOS multiplexers in area by 1.4 times, delay by 2 times, and power by 2 times respectively. The proposed 4T1R-based multiplexers operating at near-$V_t$ regime can improve Power-Delay Product by up to 5.8 times when compared to the best CMOS multiplexers working at nominal voltage.

Thus, some embodiments described herein provide, among other things, resistive random access memory based multiplexers and field programmable gate arrays. Various features and advantages of the invention are set forth in the following claims.

What is claimed is:

1. A multiplexing structure comprising:
a plurality of resistive random access memories;
a plurality of multiplexer inputs coupled to a plurality of top electrodes of the plurality of resistive random access memories;
a multiplexer output coupled to a plurality of bottom electrodes of the plurality of resistive random access memories;
a plurality of first driving elements coupled to the plurality of top electrodes; and
a second driving element coupled to the plurality of bottom electrodes, wherein the second driving element is provided in a deep N-well of the multiplexor,
wherein the plurality of first driving elements and the second driving element program the plurality of resistive random access memories;
a first voltage domain providing a power supply to the plurality of first driving elements; and
a second voltage supply providing a power supply to the second driving element, wherein the first voltage domain is one of a constant voltage domain and a switchable voltage supply and wherein the second voltage domain is the other of the constant voltage domain and the switchable voltage supply,
wherein to set a resistive random access memory from the plurality of resistive random access memories, the switchable voltage supply provides a setting voltage to the second driving element, and
wherein to reset the resistive random access memory from the plurality of resistive random access memories, the switchable voltage supply provides a resetting voltage, different from the setting voltage, to the second driving element,
the second driving element including
a first transistor connected between a first positive supply of the second voltage domain and the plurality of bottom electrodes; and
a second transistor connected between a first negative supply of the second voltage domain and the plurality of bottom electrodes,
wherein the first voltage domain is the constant voltage domain and provides a voltage of VDD at a second positive supply connected to the plurality of first driving elements and 0V at a second negative supply connected to the plurality of first driving elements, and
wherein providing the setting voltage includes providing −Vprog+2VDD at the first positive supply and providing −Vprog+VDD at the first negative supply.

2. The multiplexing structure of claim 1, further comprising:
a plurality of multiplexer input inverters provided between the plurality of multiplexer inputs and the plurality of top electrodes, wherein the first voltage domain provides the power supply to the plurality of multiplexer input inverters.

3. The multiplexing structure of claim 1, wherein providing the resetting voltage includes providing Vprog at the first positive supply and providing Vprog-VDD at the first negative supply.

4. The multiplexing structure of claim 1, wherein a nominal value of VDD is between 0.7-1V and a nominal value of Vprog is 2.5-3.5V.

5. The multiplexing structure of claim 2, wherein the plurality of multiplexer input inverters are disabled during a programming operation of the plurality of resistive random access memories.

6. The multiplexing structure of claim 1, wherein the plurality of first driving elements and the second driving element are controlled by a scan chain organization including one or more flip-flops.

7. The multiplexing structure of claim 1, wherein the plurality of first driving elements and the second driving element are controlled by a memory bank organization including one or more bit lines and one or more word lines coupled to the plurality of first driving elements and the second driving element.

8. The multiplexing structure of claim 1, further comprising:
an output inverter provided between the plurality of bottom electrodes and the multiplexer output, wherein the switchable voltage supply provides the power supply to the output inverter.

9. A field programmable gate array comprising:
a resistive random access memory including a top electrode and a bottom electrode;
a first transistor and a second transistor coupled to the top electrode;
a third transistor and a fourth transistor coupled to the bottom electrode, wherein the resistive random access memory is set when the first transistor and the fourth transistor are enabled, and wherein the resistive random access memory is reset when the second transistor and the third transistor are enabled;
a scan chain organization including:
a first flip-flop coupled to and controlling the first transistor and the fourth transistor; and
a second flip-flop coupled to and controlling the second transistor and the third transistor.

10. The field programmable gate array of claim 9, further comprising one or more voltage supplies, wherein sources of the first transistor, second transistor, third transistor, and the fourth transistor are directly connected to the one or more voltage supplies without driving inverters.

11. The field programmable gate array of claim 9, further comprising:
a constant voltage domain providing a power supply to the first transistor and the third transistor; and
a switchable voltage supply providing a power supply to the second transistor and the fourth transistor.

12. The field programmable gate array of claim 11, wherein the resistive random access memory is part of a plurality of resistive random access memories and wherein the field programmable gate array further comprises:
a plurality of multiplexer inputs coupled to a plurality of top electrodes of the plurality of resistive random access memories; and
a multiplexer output coupled to a plurality of bottom electrodes of the plurality of resistive random access memories.

13. The field programmable gate array of claim 12, wherein to set the resistive random access memory, the switchable voltage supply provides a setting voltage to the second transistor and the fourth transistor, wherein to reset the resistive random access memory, the switchable voltage supply provides a resetting voltage, different from the setting voltage, to the second transistor and the fourth transistor, and wherein one of the second transistor and the fourth transistor is coupled to a positive supply of the switchable voltage supply and the other of the second transistor and the fourth transistor is coupled to a negative supply of the switchable voltage supply.

14. The field programmable gate array of claim 13, wherein providing the setting voltage includes providing −Vprog+2VDD at the positive supply and providing −Vprog+VDD at the negative supply, and wherein providing the resetting voltage includes providing Vprog at the positive supply and providing Vprog−VDD at the negative supply.

15. A field programmable gate array comprising:
a resistive random access memory including a top electrode and a bottom electrode;
a first transistor and a second transistor coupled to the top electrode;
a third transistor and a fourth transistor coupled to the bottom electrode, wherein the resistive random access memory is set when the first transistor and the fourth transistor are enabled, and wherein the resistive random access memory is reset when the second transistor and the third transistor are enabled;
a memory bank organization including:
bit lines coupled to and controlling the first transistor and the third transistor; and
word lines coupled to and controlling the second transistor and the fourth transistor.

16. The field programmable gate array of claim 15, further comprising one or more voltage supplies, wherein sources of the first transistor, second transistor, third transistor, and the fourth transistor are directly connected to the one or more voltage supplies without driving inverters.

17. The field programmable gate array of claim 15, further comprising:
a constant voltage domain providing a power supply to the first transistor and the third transistor; and
a switchable voltage supply providing a power supply to the second transistor and the fourth transistor.

18. The field programmable gate array of claim 17, wherein the resistive random access memory is part of a plurality of resistive random access memories and wherein the field programmable gate array further comprises:
a plurality of multiplexer inputs coupled to a plurality of top electrodes of the plurality of resistive random access memories; and
a multiplexer output coupled to a plurality of bottom electrodes of the plurality of resistive random access memories.

19. The field programmable gate array of claim 18, wherein to set the resistive random access memory, the switchable voltage supply provides a setting voltage to the second transistor and the fourth transistor, wherein to reset the resistive random access memory, the switchable voltage supply provides a resetting voltage, different from the setting voltage, to the second transistor and the fourth transistor, and wherein one of the second transistor and the fourth transistor is coupled to a positive supply of the switchable voltage supply and the other of the second transistor and the fourth transistor is coupled to a negative supply of the switchable voltage supply.

20. The field programmable gate array of claim 19, wherein providing the setting voltage includes providing −Vprog+2VDD at the positive supply and providing −Vprog+VDD at the negative supply, and wherein providing the resetting voltage includes providing Vprog at the positive supply and providing Vprog-VDD at the negative supply.

* * * * *

UNITED STATES PATENT AND TRADEMARK OFFICE
CERTIFICATE OF CORRECTION

PATENT NO.         : 10,348,306 B2
APPLICATION NO.    : 15/916566
DATED              : July 9, 2019
INVENTOR(S)        : Pierre-Emmanuel Gaillardon et al.

Page 1 of 1

It is certified that error appears in the above-identified patent and that said Letters Patent is hereby corrected as shown below:

On the Title Page

Item (72) Inventors:
Please correct the spelling of the first inventor's first name from "Pierre-Emanuel" to
-- Pierre-Emmanuel --

Signed and Sealed this
Twenty-third Day of June, 2020

Andrei Iancu
*Director of the United States Patent and Trademark Office*